(12) United States Patent
Plante et al.

(10) Patent No.: US 11,892,507 B2
(45) Date of Patent: Feb. 6, 2024

(54) EARLY DETECTION OF QUALITY CONTROL TEST FAILURES FOR MANUFACTURING END-TO-END TESTING OPTIMIZATION

(71) Applicant: EXFO Inc., Québec (CA)

(72) Inventors: Jonathan Plante, Saint-Lazare (CA); Justin Whatley, Montreal (CA); Sylvain Nadeau, Vaudreuil-Dorion (CA)

(73) Assignee: EXFO INC., Quebec (CA)

( * ) Notice: Subject to any disclaimer, the term of this patent is extended or adjusted under 35 U.S.C. 154(b) by 55 days.

(21) Appl. No.: 17/891,405

(22) Filed: Aug. 19, 2022

(65) Prior Publication Data
US 2023/0060909 A1 Mar. 2, 2023

Related U.S. Application Data

(60) Provisional application No. 63/308,583, filed on Feb. 10, 2022, provisional application No. 63/260,647, filed on Aug. 27, 2021.

(51) Int. Cl.
*G01R 31/28* (2006.01)
*G01R 31/3183* (2006.01)
(Continued)

(52) U.S. Cl.
CPC ............... *G01R 31/31835* (2013.01); *G01R 31/318572* (2013.01); *G06F 18/214* (2023.01); *G06N 20/00* (2019.01)

(58) Field of Classification Search
CPC ...... G01R 31/31835; G01R 31/318572; G06N 20/00; G06F 18/214
See application file for complete search history.

(56) References Cited

U.S. PATENT DOCUMENTS 7,882,438 B2   2/2011  Markham et al.
10,578,673 B2  3/2020  Ranganathan et al.
(Continued)

FOREIGN PATENT DOCUMENTS

WO   2018204410 A1   11/2018

OTHER PUBLICATIONS

A. Adam, L. C. Chew, M. I. Shapiai, L. W. Jau, Z. Ibrahim and M. Khalid, "A Hybrid Artificial Neural Network-Naive Bayes for solving imbalanced dataset problems in semiconductor manufacturing test process," 2011 11th International Conference on Hybrid Intelligent Systems (HIS), 2011, pp. 133-138, doi: 10.1109/HIS.2011.6122093.
(Continued)

*Primary Examiner* — Samir W Rizk
(74) *Attorney, Agent, or Firm* — McDonnell Boehnen Hulbert & Berghoff LLP

(57) ABSTRACT

Example embodiments are disclosed of systems and methods for predicting failure probabilities of future product tests of a testing sequence based on outcomes of prior tests. Predictions are made by a machine-learning-based model (MLM) trained with a set of test-result sequence records (TRSRs) including test values and pass/fail indicators (PRIs) of completed tests. Within training epochs over the set, iterations are carried out over each TRSR. Each iteration involves sub-iterations carried out successively over test results of the TRSR. Each sub-iteration involves (i) inputting to the MLM values of a given test and those of tests earlier in the sequence while masking those later in the sequence, (ii) computing probabilities of test failures for the masked tests found later in the sequence than the given test, and (iii) applying the PFIs of test results later in the sequence than the given test as ground-truths to update parameters of the MLM.

20 Claims, 15 Drawing Sheets

(51) Int. Cl.
  *G06N 20/00* (2019.01)
  *G06F 18/214* (2023.01)
  *G01R 31/3185* (2006.01)

(56) References Cited

U.S. PATENT DOCUMENTS

| 10,885,259 | B2 | 1/2021 | Baidya et al. |
| 2019/0147127 | A1 | 5/2019 | Su et al. |
| 2022/0272029 | A1* | 8/2022 | Vasseur ............... H04L 45/24 |

OTHER PUBLICATIONS

S Bergmann, N Feldkamp & S Strassburger (2017) Emulation of control strategies through machine learning in manufacturing simulations, Journal of Simulation, 11:1, 38-50, DOI: 10.1057/s41273-016-0006-0.

Wuest, T., Irgens, C. & Thoben, KD. An approach to monitoring quality in manufacturing using supervised machine learning on product state data. J Intell Manuf 25, 1167-1180 (2014). https://doi.org/10.1007/s10845-013-0761-y Published Mar. 24, 2013.

Ahsan Mominul et al: "Developing Computational Intelligence for Smart Qualification Testing of Electronic Products", IEEE Access, IEEE, USA, vol. 8, Jan. 17, 2020 (Jan. 17, 2020), pp. 16922-16933, XP011769063, DOI: 10.1109/ACCESS.2020.2967858 [retrieved on Jan. 27, 2020] * p. 16924, paragraph II.—p. 16928, paragraph IV.B *.

Stoyanov Stoyan et al: "Predictive analytics methodology for smart qualification testing of electronic components", Journal of Intelligent Manufacturing, Springer US, New York, vol. 30, No. 3, Jan. 18, 2019 (Jan. 18, 2019), pp. 1497-1514, XP036709788, ISSN: 0956-5515, DOI: 10.1007/S10845-018-01462-9 [retrieved on Jan. 18, 2019] * p. 1499, paragraph Methodology and computational approach—p. 1504 *.

European Search Report and Search Opinion, Application No. EP 22191328.8, Search Completed Feb. 3, 2023, 8 pages.

* cited by examiner

Test-Result Sequence Records (TRSRs)

Master Set of Product Tests: *T1 – T<M>*

Test-Result Sequence Record (TRSR) 602

| Designated Product Test (DPT) | | ● ● ● up to M ● ● ● | Designated Product Test (DPT) | |
|---|---|---|---|---|
| Test-Value Metric (TVM) | Pass/Fail Indicator (PFI) | | Test-Value Metric (TVM) | Pass/Fail Indicator (PFI) |

Example: M = 8, all DPTs run in sequence
TRSR 604

| DPT1 | | DPT2 | | DPT3 | | DPT4 | | DPT5 | | DPT6 | | DPT7 | | DPT8 | |
|---|---|---|---|---|---|---|---|---|---|---|---|---|---|---|---|
| TVM1 | PFI1 | TVM2 | PFI2 | TVM3 | PFI3 | TVM4 | PFI4 | TVM5 | PFI5 | TVM6 | PFI6 | TVM7 | PFI7 | TVM8 | PFI8 |

FIG. 6A

Examples: M = 8, other DPT sequences

TRSR 606

| DPT1 | DPT2 | DPT3 | DPT4 | DPT5 | DPT6 | DPT7 | DPT8 |
|---|---|---|---|---|---|---|---|
| 14.2 | 21.5 | 0.77 | 107.2 | 93.3 | 111.6 | 6.3 | 9.75 |
| 1 | 1 | 1 | 0 | 0 | 1 | 0 | 1 |

TRSR 608

| DPT1 | DPT2 | DPT7 | DPT4 | DPT5 |
|---|---|---|---|---|
| 8.2 | 32.7 | 4.9 | 101.5 | 110.3 |
| 0 | 1 | 1 | 0 | 1 |

TRSR 610

| DPT2 | DPT3 | DPT8 | DPT4 |
|---|---|---|---|
| 27.2 | 0.57 | 8.98 | 112.1 |
| 1 | 0 | 1 | 1 |

TRSR 612

| DPT1 | DPT3 | DPT4 | DPT8 | DPT6 | DPT7 |
|---|---|---|---|---|---|
| 15.1 | .81 | 110.6 | 7.43 | 103.3 | 4.3 |
| 1 | 1 | 1 | 0 | 0 | 1 |

FIG. 6B

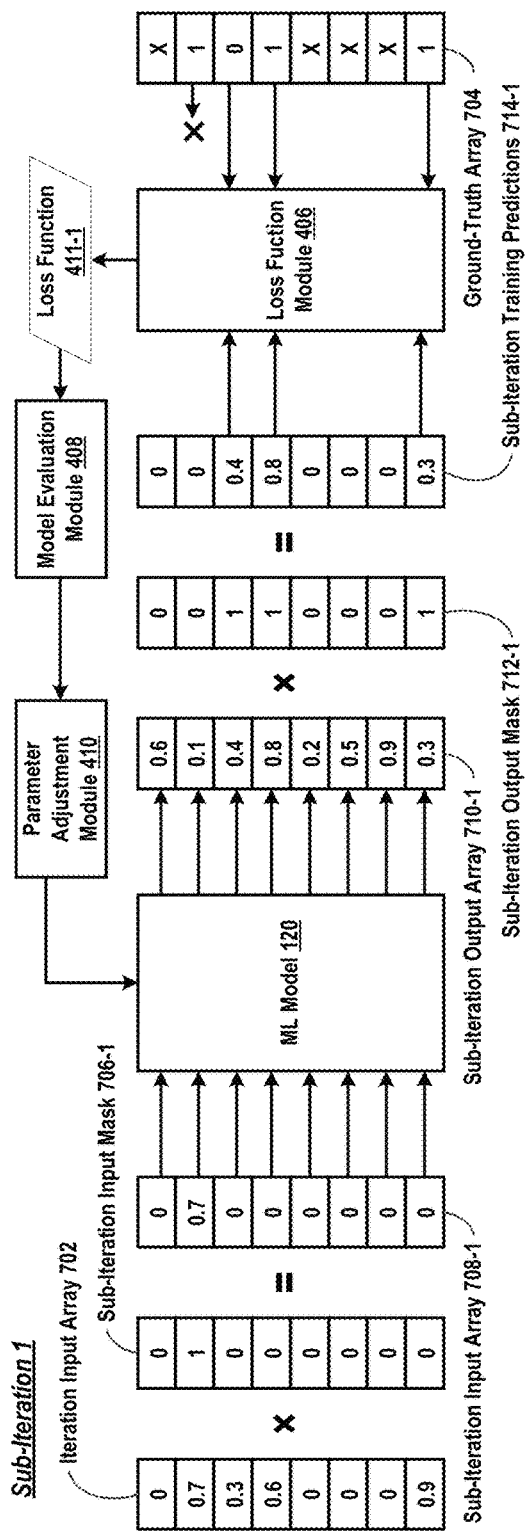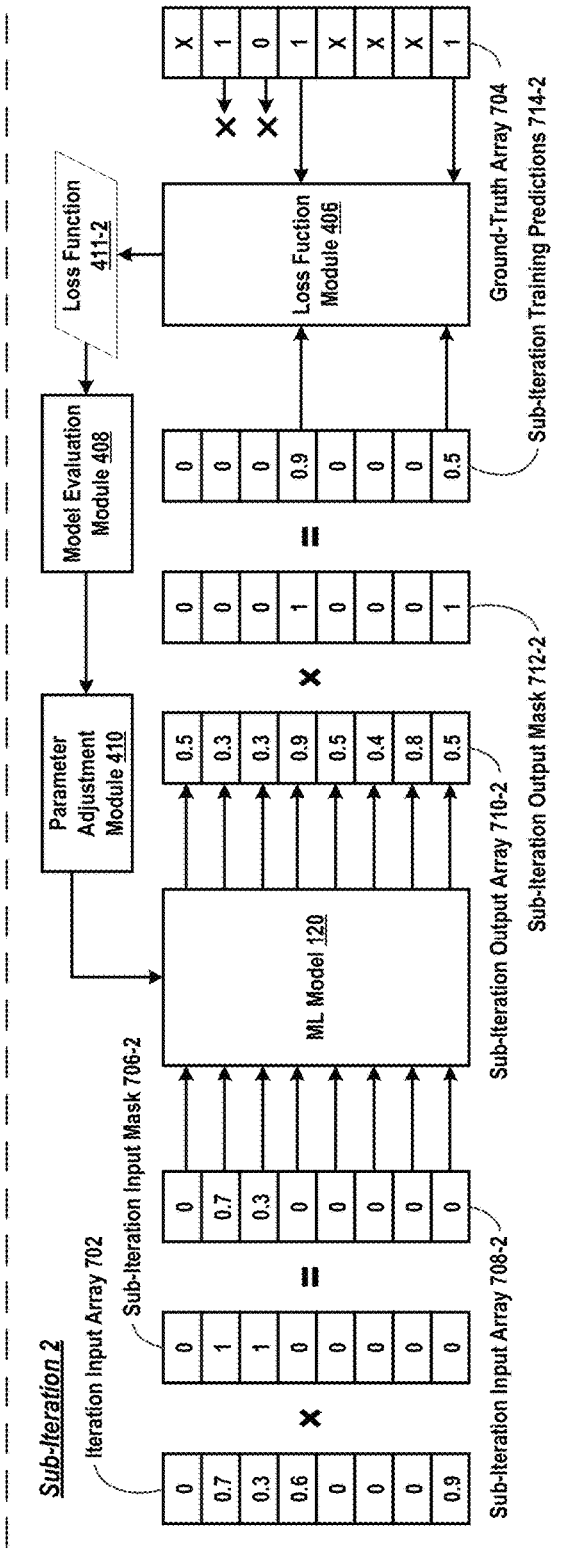

Example Runtime (Inference) Operation:

- Construct Runtime Test Sequence (Fig. 8A)
- Test product in sequence order with model predictions after each test to predict Failure probabilities of future test outcomes and decide if/how to proceed (Figs. 8B-E)

Runtime Test Sequence 801: | DPT1 | DPT2 | DPT5 | DPT3 | DPT6 |

FIG. 8A

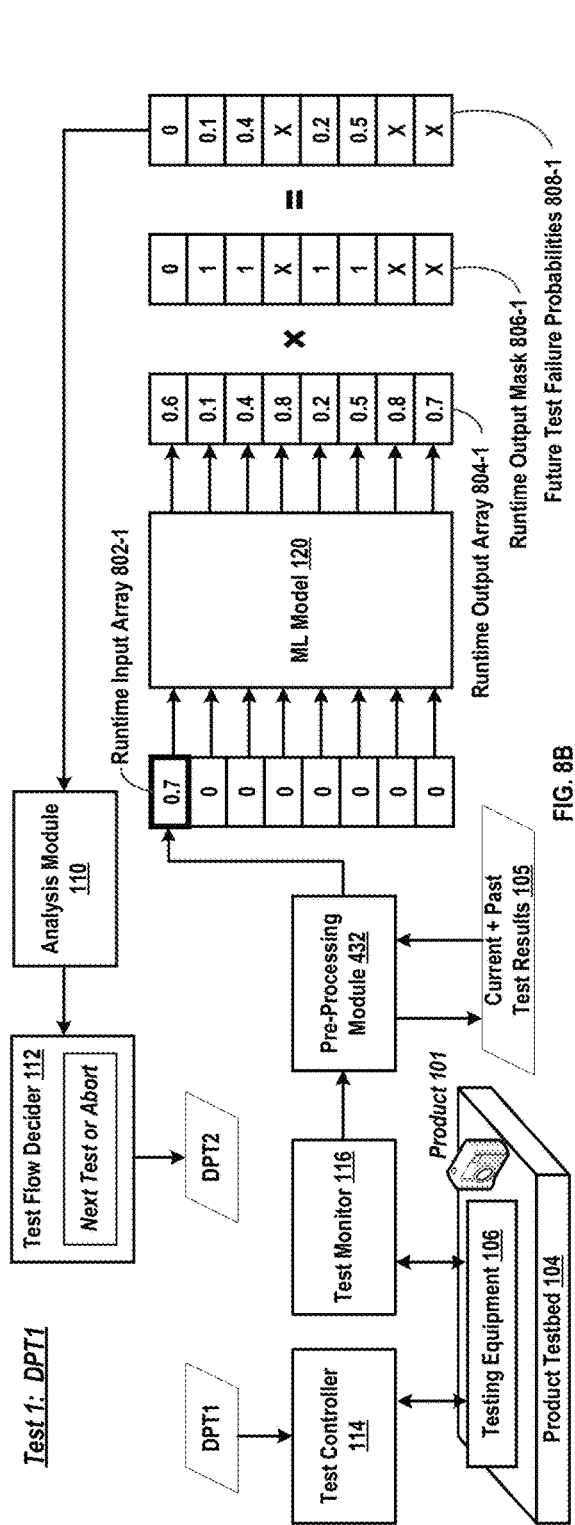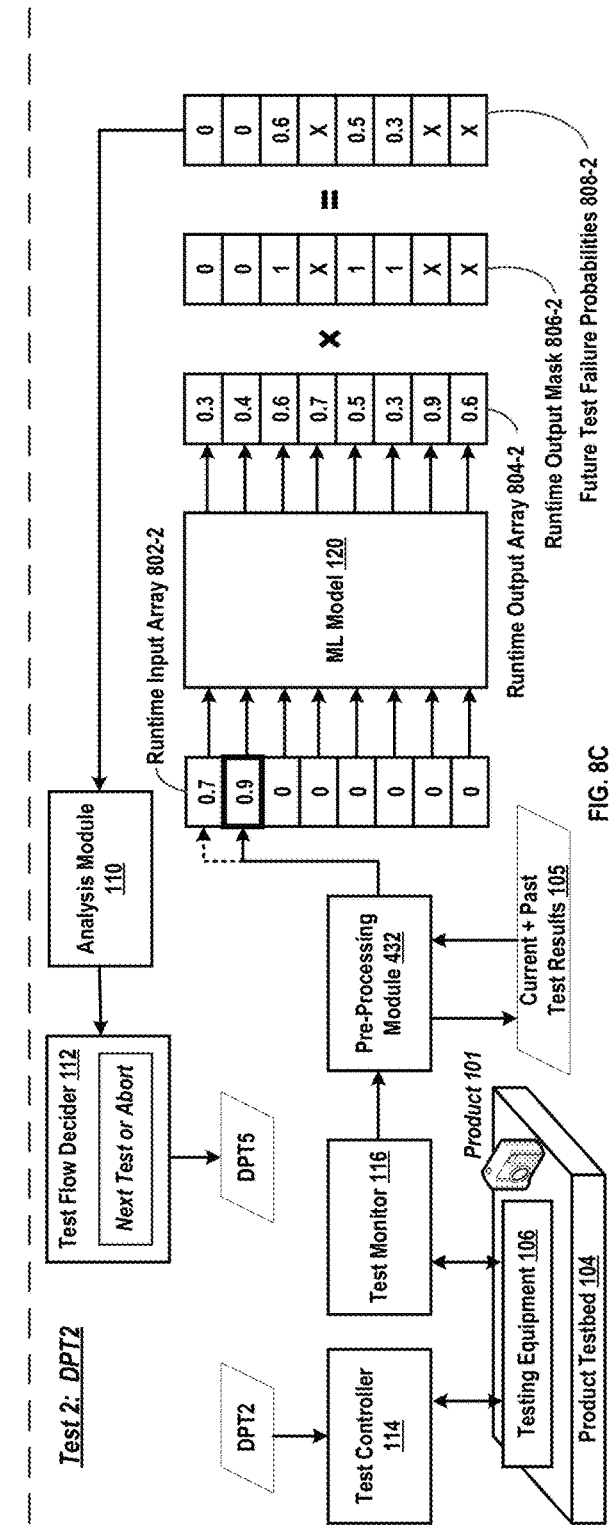
FIG. 8B
FIG. 8C

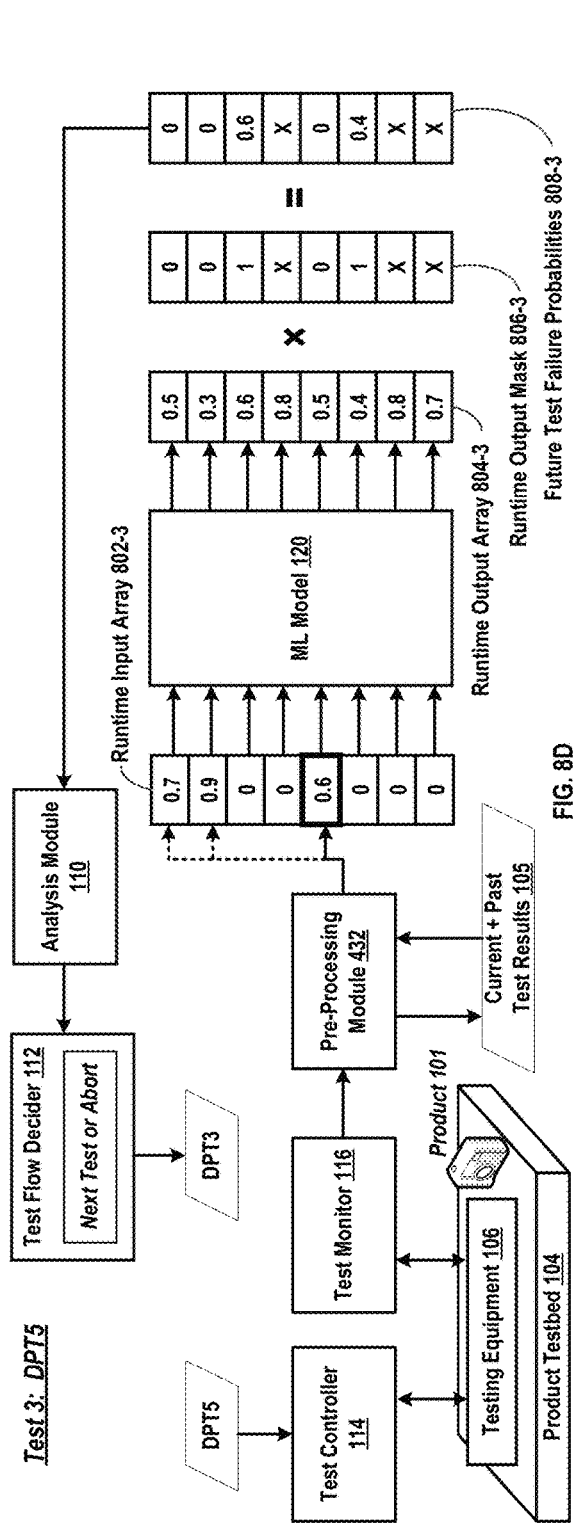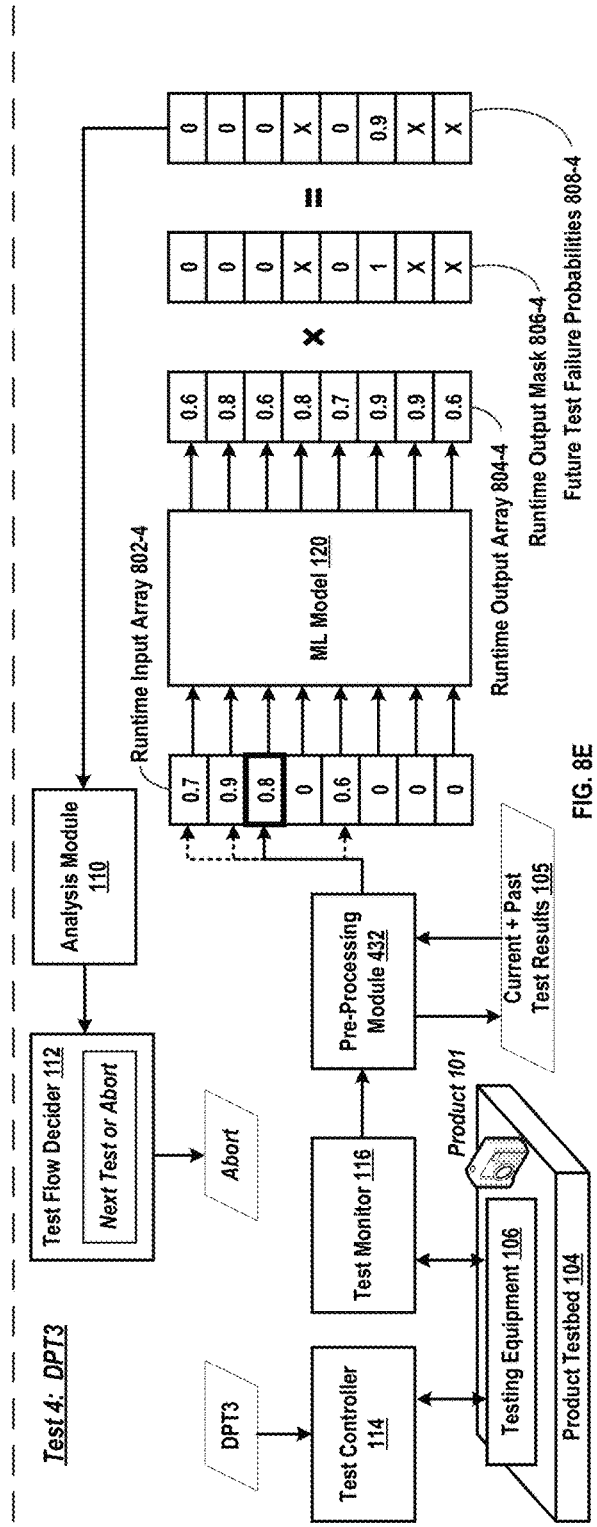
FIG. 8D
FIG. 8E

EARLY DETECTION OF QUALITY CONTROL TEST FAILURES FOR MANUFACTURING END-TO-END TESTING OPTIMIZATION

CROSS-REFERENCE TO RELATED APPLICATIONS

This application claims priority under 35 U.S.C. § 119(e) to U.S. Provisional Patent Application Ser. No. 63/260,647, filed on Aug. 27, 2021, and U.S. Provisional Patent Application Ser. No. 63/308,583, filed on Feb. 10, 2022, both of which are incorporated herein in their entireties by reference.

BACKGROUND

Product manufacturing may typically involve some form of quality assurance testing to certify product compliance and quality. Failed manufacturing tests may necessitate repairs of a unit under test. In some instance the unit may be discard if repairs are not possible or practical. It may be of interest to a manufacturer to implement efficient and effective test procedures.

SUMMARY

Performing such manufacturing tests may incur costs in time, money, resources, energy, among other factors, so the ability to reduce the number of manufacturing tests and/or alter testing procedures through the early detections (or prediction) of failures may help improve the manufacturing process.

Conventional use of neural networks and other machine-learning based techniques in manufacturing generally aims to detect production defects or anomalies with monitoring systems. These techniques do not focus on predicting future manufacturing test failures.

Manufacturing test sequences can vary in their order and the particular manufacturing tests performed. For example, one sequence may be composed of manufacturing tests 1, 2, 3, 4, and 5 whereas another sequence may have manufacturing tests 3, 7, 1, 2 and 9. The lack of structure in the sequences can make tasks involved in performing predictions on sequential data more difficult. Further, the order of these manufacturing tests may have no bearing on future results. Also, because failed manufacturing tests do not necessarily warrant throwing the product away, repairs/corrections and retests will often change the sequence of the manufacturing tests for a unit.

Recurrent networks, such as RNN's, LSTM's, GRU's, may be useful for forecasting or test generation where the order of a sequence will influence the output, but they tend to learn temporal dependencies which may not always be appropriate for manufacturing tests. Recurrent models update a hidden state at each time step, which theoretically contains all useful information from the past. The hidden state may then be used to update the next hidden state. This exemplifies how the order of the sequence can have an impact on the hidden states, with the most recent inputs having more weight on the model's predictions.

The inventors have recognized the need for a solution that does not have these limitations when a temporal dependency between tests may or may not be important but can still find meaningful relationships in temporal data. The inventors have also recognized that predicting that a future test will fail can save time by allowing an early termination of the test sequence, a skipping ahead to the test that is predicted to fail, and/or an optimization of the sequence order to save resources (i.e., time and money).

In view of the shortcomings of conventional applications of artificial neural networks and other machine-learning based models of artificial intelligence to product testing, as well as the benefits of predicting test outcomes without temporal dependencies, the inventors have devised techniques for predicting failure probabilities of product tests in a sequence of tests carried out on a given unit of a particular product. More specifically, in a sequence of distinct product tests carried out on a given unit of a particular product, failure probabilities of tests scheduled in a future segment of the sequence may be predicted based on test outcomes of earlier product tests that were completed during a prior segment of the testing sequence. In particular, a machine-learning based model, such as an artificial neural network may be trained to make the predictions, and then be employed in a product testing system that can monitor product testing results, predict future test results based on current ones, and enable planned testing sequences to be modified or altered based on the predictions.

Accordingly, in one aspect, example embodiments may involve a method carried out by a computing system that includes a computational implementation of a machine-learning-based model (MLM) configured for predicting failure probabilities of product tests scheduled in a future segment of a testing sequence based on test outcomes of different product tests completed during a prior segment of the testing sequence. The method may include: receiving a set of computer-readable training test-result sequence records (TRSRs), each respective training TRSR comprising a sequence of test results corresponding to a sequence of associated designated product tests (DPTs) previously carried out on a respective unit of a test plurality of units of a particular product, wherein each test result of the associated DPT includes a test-value metric (TVM) characterizing a particular aspect of the respective unit tested, and a pass/fail indicator (PFI) indicating whether the respective unit tested passed or failed the associated DPT, and wherein the DPTs of the corresponding sequence of associated DPTs are a subset of a master set of DPTs for testing the particular product; within each of one or more training epochs carried out over the set of training TRSRs, carrying out a respective training iteration over each respective training TRSR of the set, wherein each respective training iteration comprises a sequence of training sub-iterations carried out successively over each given test result of the respective training TRSR, from a first test result to a last test result, wherein each training sub-iteration comprises: (i) inputting to the MLM input data comprising the TVM of the given test result and the TVMs of any test results earlier in the sequence than the given test result, (ii) based on the input data, computing with the MLM respective predicted probabilities of test failures for the DPTs associated with all test results later in the sequence than the given test result, and (iii) based on the PFIs of all the test results later in the sequence than the given test result being applied as ground-truths, training the MLM to increase a statistical confidence of the predicted probabilities; and upon achieving, from the respective training iterations of the one or more training epochs, one or more thresholds of the statistical confidence of the predicted probabilities, configuring the trained MLM for runtime implementation among one or more computing devices.

In another aspect, example embodiments may involve a computing system comprising a computational implementation of a machine-learning-based model (MLM) configured for predicting failure probabilities of product tests scheduled in a future segment of a testing sequence based on test outcomes of different product tests completed during a prior segment of the testing sequence. The computing system may be configured for carrying out operations including: receiving a set of computer-readable training test-result sequence records (TRSRs), each respective training TRSR comprising a sequence of test results corresponding to a sequence of associated designated product tests (DPTs) previously carried out on a respective unit of a test plurality of units of a particular product, wherein each test result of the associated DPT includes a test-value metric (TVM) characterizing a particular aspect of the respective unit tested, and a pass/fail indicator (PFI) indicating whether the respective unit tested passed or failed the associated DPT, and wherein the DPTs of the corresponding sequence of associated DPTs are subset of a master set of DPTs for testing the particular product; within each of one or more training epochs carried out over the set of training TRSRs, carrying out a respective training iteration over each respective training TRSR of the set, wherein each respective training iteration comprises a sequence of training sub-iterations carried out successively over each given test result of the respective training TRSR, from a first test result to a last test result, wherein each training sub-iteration comprises: (i) inputting to the MLM input data comprising the TVM of the given test result and the TVMs of any test results earlier in the sequence than the given test result, (ii) based on the input data, computing with the MLM respective predicted probabilities of test failures for the DPTs associated with all test results later in the sequence than the given test result, and (iii) based on the PFIs of all the test results later in the sequence than the given test result being applied as ground-truths, training the MLM to increase a statistical confidence of the predicted probabilities; and upon achieving, from the respective training iterations of the one or more training epochs, one or more thresholds of the statistical confidence of the predicted probabilities, configuring the trained MLM for runtime implementation among one or more computing devices.

In yet another aspect, example embodiments may involve a method carried out by a computing system that includes a computational implementation of a machine-learning-based model (MLM) configured for predicting failure probabilities of product tests scheduled in a future segment of a testing sequence based on test outcomes of different product tests completed during a prior segment of the testing sequence. The MLM may be trained with a set of computer-readable training test-result sequence records (TRSRs), each respective training TRSR comprising a sequence of test results corresponding to a sequence of associated designated product tests (DPTs) previously carried out on a respective unit of a test plurality of units of a particular product, wherein each test result of the associated DPT includes a test-value metric (TVM) characterizing a particular aspect of the respective unit tested, and a pass/fail indicator (PFI) indicating whether the respective unit tested passed or failed the associated DPT, and wherein the DPTs of the corresponding sequence of associated DPTs are a subset of a master set of DPTs for testing the particular product. Training may be arranged to train the MLM to predict, to one or more statistical confidence thresholds, probabilities of test failures for DPTs in a sub-sequence of any given testing sequence, based on input comprising TVMs in the any given testing sequence that precede the sub-sequence. The method may include: inputting to the trained MLM runtime input data comprising runtime TVMs obtained from runtime DPTs of a first segment of a runtime test sequence already carried out on a runtime unit of the particular product, wherein the runtime unit is not part of the test plurality; and based on the runtime input data, computing with the trained MLM predicted runtime probabilities of runtime test failures for all runtime DPTs of a second segment of the runtime test sequence comprising runtime DPTs not yet carried out on the runtime unit of the particular product, wherein the second segment follows the first segment in the runtime test sequence.

In still another aspect, example embodiments may involve an article of manufacture including a non-transitory computer-readable medium, having stored thereon program instructions that, when executed by one or more processors of a system, cause the system to carry out various operations of the example methods and/or steps of the above embodiments.

These, as well as other embodiments, aspects, advantages, and alternatives, will become apparent to those of ordinary skill in the art by reading the following detailed description, with reference where appropriate to the accompanying drawings. Further, this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

BRIEF DESCRIPTION OF THE DRAWINGS

FIGS. 6A-6B illustrate example test-result sequence records for training a ML-based model for predicting product-testing results, in accordance with example embodiments.

FIGS. 7A-7E illustrate example operations of training a ML-based model for predicting product-testing results, in accordance with example embodiments.

FIGS. 8A-8E illustrate example runtime operations of a ML-based product testing system, in accordance with example embodiments.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless stated as such. Thus, other embodiments can be utilized and other changes can be made without departing from the scope of the subject matter presented herein. Accordingly, the example embodiments described herein are not meant to be limiting. It will be readily understood that the aspects of the present disclosure, as generally described herein, and illustrated in the figures, can be arranged, substituted, combined, separated, and designed in a wide variety of different configurations.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

I. Example Product Testing System

A. Example System Architecture

Figure 1:
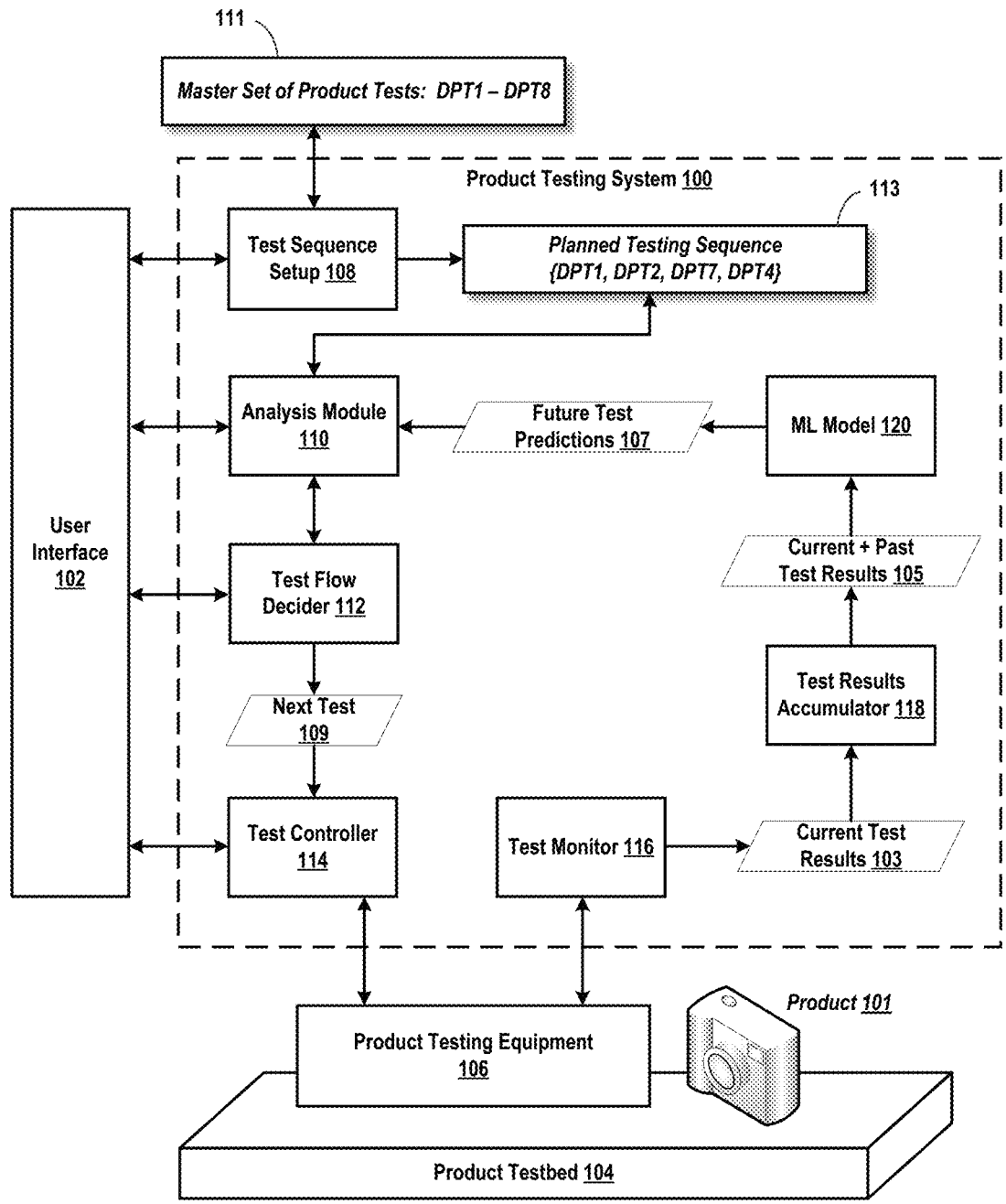
FIG. 1 is a simplified block diagram showing components of a product testing system employing a ML-based model for predicting test results, in accordance with example embodiments.

FIG. 1 is a simplified block diagram showing components of a product testing system 100 employing a ML-based model for predicting test results, that may be configured to carry out various tasks and operations described herein. The block diagram of FIG. 1 may also be considered as depicting aspects of an operational architecture of the system 100. The product testing system 100 can include various components, any one or more of which may be implemented as or in one or more computing devices. As such, components of the product testing system 100 may themselves be or include hardware, software, firmware, or combinations thereof. Some of the components of the product testing system 100 may be identified structurally, such as databases or other forms of data storage and management, and others may be identified in terms of their operation or function. Operational and/or functional components could be implemented as software and/or hardware modules, for example, and will sometimes be referred to herein as "modules" for the purpose of the present discussion.

The product testing system 100 can also include one or more connection mechanisms that connect various components within the system 100. By way of example, the connection mechanisms are depicted as arrows between components. The direction of an arrow may indicate a direction of information flow, though this interpretation should not be viewed as limiting. In this disclosure, the term "connection mechanism" means a mechanism that connects and facilitates communication between two or more components, devices, systems, or other entities. A connection mechanism can include a relatively simple mechanism, such as a cable or system bus, and/or a relatively complex mechanism, such as a packet-based communication network (e.g., the Internet). In some instances, a connection mechanism can include a non-tangible medium, such as in the case where the connection is at least partially wireless. A connection mechanism may also include programmed communication between software and/or hardware modules or applications, such as application program interfaces (APIs), for example. In this disclosure, a connection can be a direct connection or an indirect connection, the latter being a connection that passes through and/or traverses one or more entities, such as a router, switcher, or other network device. Likewise, in this disclosure, communication (e.g., a transmission or receipt of data) can be a direct or indirect communication.

For illustrative purposes, the product testing system 100 is shown to be configured for controlling and/or managing product testing of an example product 101, which is depicted, by way of example, as a digital camera device. The choice of a digital camera as an example product serves only as a convenience in describing the example product testing system 100, and is otherwise arbitrary, and should not be interpreted as limiting in any way of example embodiments herein. In practice, testing may involve running tests on multiple units of the product 101. As such, the product 101 in FIG. 1 may represent a specific unit under test, as well as a particular product model of which there may be many units to be tested.

The example product testing system 100 may be communicatively connected to product testing equipment 106 that may then be connected to, or integrated with, a product testbed 104. It may be assumed that the product testbed 104 may be configured to interface with any given unit of the product 101 in such a manner that the given unit may be subject to a sequence of specific tests, referred to herein as "designated product tests" or "DPTs." Each DPT may be configured and/or designed to test a particular aspect of a given product unit under test. For example, DPTs may test particular components of sub-components of the given unit. Upon test execution, each particular DPT may yield an outcome that includes some form of measurement value, and a "pass/fail indicator" that indicates whether the particular DPT passed or failed. Measurement values of DPTs are referred to herein as "test-value metrics" or "TVMs." Pass/fail indicators of DPTs are referred to herein as "PFIs." Non-limiting examples of properties or characteristics of TVMs include voltage, amperage, tension, and/or other measurable electrical and/or mechanical properties. PFI may be binary indicators of whether the associated TVM meets a specified requirement, for example. Thus, a PFI=0 may indicate failure, and a PFI=1 may indicate success.

The example product testing system 100 may also be communicatively connected with a user interface 102. The user interface 102 may be a computer with a monitor and one or more user input devices, such as a keyboard and mouse, for example. In some implementations, the user interface 102 may be part of the product testing system 100. As described below, a user may interact with the product testing system 100 through the user interface 102. User interaction may involve setting up one or more testing sequences for one or more product units, where each testing sequence may include particular DPTs arranged in a particular order. User interaction may also involve viewing and/or analyzing test results, and controlling testing by modifying testing sequences based, for example, on intermediate test results. In particular, the product testing system 100 may be configured to use artificial intelligence to predict future test outcomes of a given sequence based on those tests already carried out. These operations and others are described in more detail below. The examples of user interaction just mentioned do not represent a complete set of possible user interactions, and should not be viewed as limiting with respect to example embodiments herein.

Non-limiting example components of the product testing system 100 include a test sequence setup module 108, an analysis module 110, a test flow decider module 112, a test controller module 114, a test monitor module 116, a test results accumulator module 118, and a machine learning (ML) model 120. In example embodiments, the ML model 120 may provide an artificial intelligence engine for analyzing and/or evaluating current and past results in order to predict future test results.

Generally, the product testing system 100 may operate in two modes: training mode and runtime mode. In training mode, the (ML) model 120, possibly as well as other ML-based components not shown but that may be part of the system 100, are "trained" to accomplish various tasks. In particular, the ML model 120 may be trained to predict probabilities that future DPTs of a testing sequence will fail (or pass) based on already-completed DPTs of the testing sequence. In some example embodiments, the ML model 120 may be implemented as an artificial neural network (ANN), such as a deep learning network. However, other types of ML-based models for artificial intelligence may be used. An example ANN is described later in this disclosure. Training of the ML model 120 may be carried out during training mode operations, which are described in further detail below.

In runtime mode, also referred to herein as "inference mode" or just "inference" operation, the product testing system 100 may enable or facilitate, possibly by user interaction (e.g., via the user interface 102), control and/or modification of one or more testing sequences based on runtime predictions of the trained ML model 120. Considering a scenario involving user interaction via the user interface 102, runtime operations may be described at a high level as follows.

In accordance with example embodiments, the user interface 102 may enable a user to interact with the test sequence setup module 108 in order to create one or more test sequences. In practice, there may be a "master set" 111 of product tests available to choose from for testing the product 101. For illustrative purposes, and by way of example, the master set 111 is depicted as containing DPT1-DPT8. Each of these could be test identifiers that may be recognizable by the product testing equipment 106, for example. The test sequence setup module 108 may access the master set 111 and enable the user to select particular DPTs and to set an order to create one or more testing sequences. For illustrative purposes, and by way of example, a planned testing sequence 113 is depicted as containing {DPT1, DPT2, DPT7, DPT4}. The test sequence setup module may also enable the user to set parameters that may be associated with one or more of the selected DPTs.

The analysis module 110 may then access the testing sequence 113 and initiate testing of the product 101 according to the testing sequence. The analysis module 110 may indicate to the test flow decider module that there are no prior test result to analyze. The test flow decider may then set the next test 109 to be DPT1, the first test of the testing sequence 113, and pass it to the test controller 114, which may then initiate DPT1 with the product testing equipment 106 and product testbed 104.

Results of DPT1 carried out on the product 101 may be received and/or monitored by the test monitor 116, and pass them as current test results 103 to the test results accumulator module 118. The test results accumulator module 118 may then store the current and past test results 105, and also pass them to the trained ML model 120 for predictions of future test failure probabilities. For the first test, DPT1 in this example, there will be no prior (past) test results, so current and past test results 105 will only contain the current results—those of DPT1 in this example. However, as successive tests are carried out, current and past test results 105 will become a record of all past test plus the results of whatever the current test happens to be.

The ML model 120 may then predict probabilities of test failure for all tests in the testing sequence 113 that are listed (or scheduled) after the just-completed current test in the testing sequence. For this example with the current test being DPT1, the ML model 120 may predict failure probabilities for {DPT2, DPT7, DPT4}, since these are the future tests of the sequence 113.

The future test failure probabilities, indicated as future test predictions 107 in FIG. 1, may then be inputted into the analysis module 110, which can apply various thresholds and/or other criteria to provide quantitative information that can help guide if and how future testing can or should be conducted. For example, if a failure probability for a particular future test is 75% (0.75), the analysis module 110 may compare this to a threshold for aborting test before the particular test even begins. Results of the analysis module 110 may be viewed and/or evaluated by a user via the user interface 102. This access may also enable a user to carry out specific analyses, such adjusting threshold or testing hypothetical scenarios, for example.

In further accordance with example embodiments, results of the analysis module 110 may also be passed to the test decider module 112, which may present options to the user via the user interface 102. In an example scenario, the failure probability for DPT2 in the testing sequence 113 may be 35%, while the threshold for aborting is 70%. In this case, a user may choose to continue with testing DPT2 in accordance with the testing sequence 113. In some use cases, proceeding with DPT2 (or any future test) may be automatic if one or another threshold condition is met. In some embodiments, a user may be able to modify the testing sequence based on analysis results, instead of aborting all testing. Other test flow actions may be possible as well. The selected and/or chosen next test 109 may then be passed from the test flow decider module 112 to the test controller.

The process may then continue to the next test 109. As noted above, when the next test 109 is not the first test of a testing sequence, such as DPT2 of testing sequence 113, the current and past test results 105 generated by the test results accumulator 118 will become an evolving record of all past test plus the results of the current test, such as DPT2. As described in detail below, the ML model 120 may be configured to receive as input current and past test results, and compute, based on the input, predicted probabilities for tests of a testing sequence that have not yet been carried out. The process may continue until all tests of a sequence have been carried out.

Advantageously, the predictions computed after each successive test of a testing sequence may allow the testing procedure carried out by the product testing system 100 to be modified in such a way that may avoid unnecessary waste of time, resources, and/or efforts for tests that can reasonably be expected to fail based on current and past test results. These benefits may be significant and/or substantial, and help improve the efficiency, speed, and reliability of product testing, particularly when compared with otherwise unconditional progression through testing sequences.

B. Example Computing Devices and Cloud-Based Computing Environments

Figure 2:
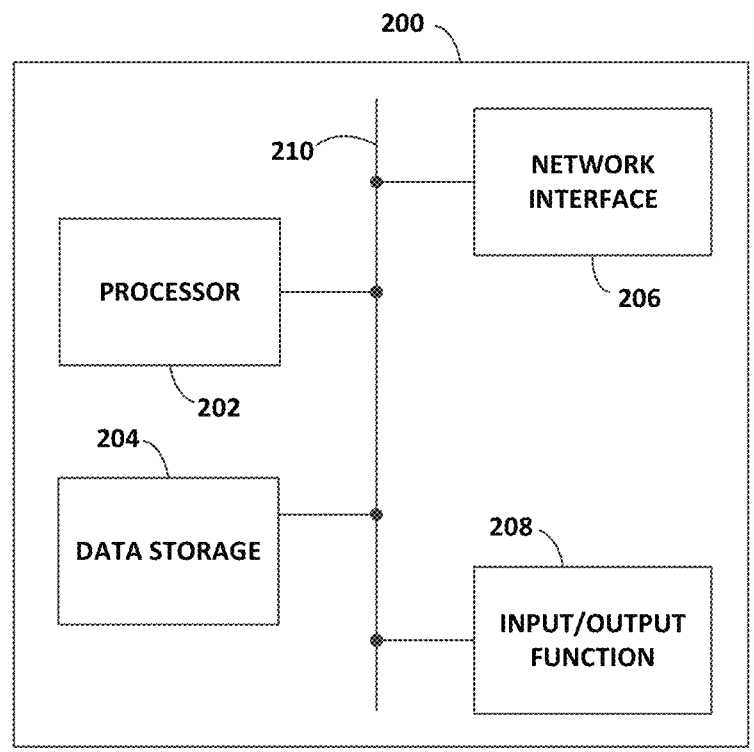
FIG. 2 illustrates a schematic drawing of a computing device, according to an example embodiment.

FIG. 2 is a simplified block diagram exemplifying a computing device 200, illustrating some of the functional components that could be included in a computing device arranged to operate in accordance with the embodiments herein. Example computing device 200 could be a personal computer (PC), laptop, server, or some other type of computational platform. For purposes of simplicity, this specification may equate computing device 200 to a server from time to time, and may also refer to some or all of the components of computing device 200 as a "processing unit." Nonetheless, it should be understood that the description of computing device 200 could apply to any component used for the purposes described herein.

In this example, computing device 200 includes a processor 202, a data storage 204, a network interface 206, and an input/output function 208, all of which may be coupled by a system bus 210 or a similar mechanism. Processor 202 can include one or more CPUs, such as one or more general purpose processors and/or one or more dedicated processors (e.g., application specific integrated circuits (ASICs), graphical processing units (GPUs), digital signal processors (DSPs), network processors, etc.).

Data storage 204, in turn, may comprise volatile and/or non-volatile data storage and can be integrated in whole or in part with processor 202. Data storage 204 can hold program instructions, executable by processor 202, and data that may be manipulated by these instructions to carry out the various methods, processes, or functions described herein. Alternatively, these methods, processes, or functions can be defined by hardware, firmware, and/or any combination of hardware, firmware and software. By way of example, the data in data storage 204 may contain program instructions, perhaps stored on a non-transitory, computer-readable medium, executable by processor 202 to carry out any of the methods, processes, or functions disclosed in this specification or the accompanying drawings.

Network interface 206 may take the form of a wireline connection, such as an Ethernet, Token Ring, or T-carrier connection. Network interface 206 may also take the form of a wireless connection, such as IEEE 802.11 (Wifi), BLUETOOTH®, or a wide-area wireless connection. However, other forms of physical layer connections and other types of standard or proprietary communication protocols may be used over network interface 206. Furthermore, network interface 206 may comprise multiple physical interfaces.

Input/output function 208 may facilitate user interaction with example computing device 200. Input/output function 208 may comprise multiple types of input devices, such as a keyboard, a mouse, a touch screen, and so on. Similarly, input/output function 208 may comprise multiple types of output devices, such as a screen, monitor, printer, or one or more light emitting diodes (LEDs). Additionally or alternatively, example computing device 200 may support remote access from another device, via network interface 206 or via another interface (not shown), such as a universal serial bus (USB) or high-definition multimedia interface (HDMI) port.

In some embodiments, one or more computing devices may be deployed in a networked architecture. The exact physical location, connectivity, and configuration of the computing devices may be unknown and/or unimportant to client devices. Accordingly, the computing devices may be referred to as "cloud-based" devices that may be housed at various remote locations.

Figure 3:
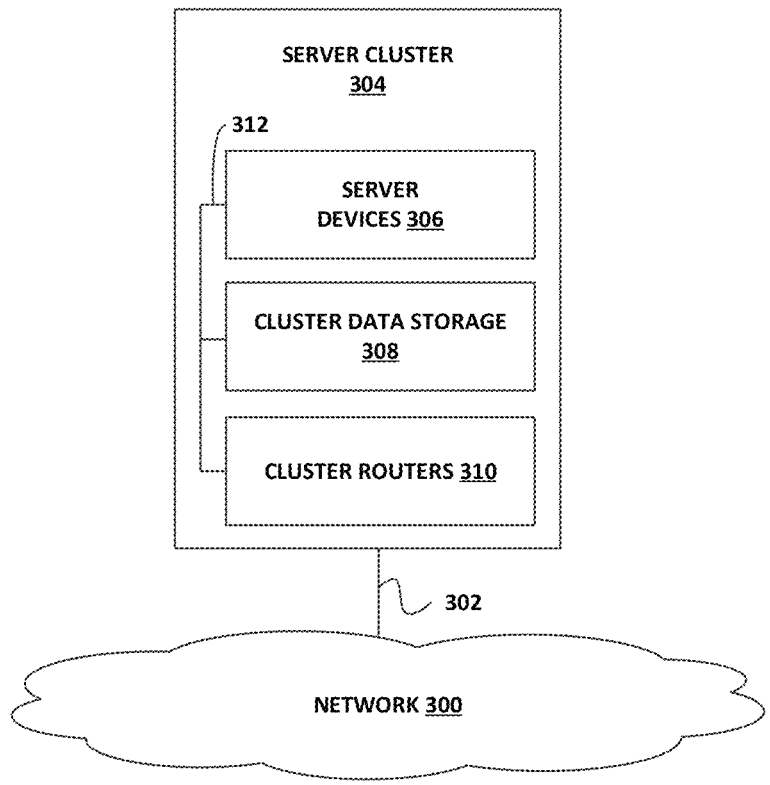
FIG. 3 illustrates a schematic drawing of a networked server cluster, according to an example embodiment.

FIG. 3 depicts a cloud-based server cluster 304 in accordance with an example embodiment. In FIG. 3, functions of computing device 200 may be distributed between server devices 306, cluster data storage 308, and cluster routers 310, all of which may be connected by local cluster network 312. The number of server devices, cluster data storages, and cluster routers in server cluster 304 may depend on the computing task(s) and/or applications assigned to server cluster 304.

For example, server devices 306 can be configured to perform various computing tasks of computing device 200. Thus, computing tasks can be distributed among one or more of server devices 306. To the extent that these computing tasks can be performed in parallel, such a distribution of tasks may reduce the total time to complete these tasks and return a result.

Cluster data storage 308 may be data storage arrays that include disk array controllers configured to manage read and write access to groups of hard disk drives and/or solid state drives. The disk array controllers, alone or in conjunction with server devices 306, may also be configured to manage backup or redundant copies of the data stored in cluster data storage 308 to protect against disk drive failures or other types of failures that prevent one or more of server devices 306 from accessing units of cluster data storage 308.

Cluster routers 310 may include networking equipment configured to provide internal and external communications for the server clusters. For example, cluster routers 310 may include one or more packet-switching and/or routing devices configured to provide (i) network communications between server devices 306 and cluster data storage 308 via cluster network 312, and/or (ii) network communications between the server cluster 304 and other devices via communication link 302 to network 300.

Additionally, the configuration of cluster routers 310 can be based at least in part on the data communication requirements of server devices 306 and cluster data storage 308, the latency and throughput of the local cluster network 312, the latency, throughput, and cost of communication link 302, and/or other factors that may contribute to the cost, speed, fault-tolerance, resiliency, efficiency and/or other design goals of the system architecture.

As noted, server devices 306 may be configured to transmit data to and receive data from cluster data storage 308. This transmission and retrieval may take the form of SQL queries or other types of database queries, and the output of such queries, respectively. Additional text, images, video, and/or audio may be included as well. Furthermore, server devices 306 may organize the received data into web page or web application representations. Such a representation may take the form of a markup language, such as the hypertext markup language (HTML), the extensible markup language (XML), or some other standardized or proprietary format. Moreover, server devices 306 may have the capability of executing various types of computerized scripting languages, such as but not limited to Perl, Python, PHP Hypertext Preprocessor (PHP), Active Server Pages (ASP), JAVASCRIPT®, and so on. Computer program code written in these languages may facilitate the providing of web pages to client devices, as well as client device interaction with the web pages. Alternatively or additionally, JAVA® or other languages may be used to facilitate generation of web pages and/or to provide web application functionality.

C. Example Framework for Machine Learning Model Training and Operation

In accordance with example embodiments, the ML model 120 shown as part of the product testing system 100 may be employed as a form of artificial intelligence engine or facility for analyzing and/or evaluating current and past test results in order to predict future test results. As described above, the ML model 120 may be implemented as an ANN.

The ML model 120 may receive a data array of test results as input, and compute a data array of predicted failure (or success) probabilities as output. When implemented as an ANN, the ML model 120 may be configured with a plurality of input nodes and a plurality of output nodes corresponding to all possible DPTs of a given product under test.

Considering FIG. 1, the input data array and output data array may correspond in dimensions to the master set 111 of DPTs. However, any given testing sequence may include fewer than a master set of DPTs. Additionally or alternatively, there will be no test results for any DPTs of a sequence not yet carried out. Consequently, there may be fewer actual test results in an input data array than the total number of possible inputs to the ML model 120 (e.g., input nodes) on any given application of the model. Both instances may be accounted for during training and runtime operation by applying an input mask to the input data array. Similarly, an output mask may be applied to the outputs of the ML model 120 (e.g., output nodes) in order to pick out only those outputs that are valid and/or relevant to future DPTs. In accordance with example embodiments, input and output masking may be performed as part of model operations.

In many implementations of ML models, such as ANNs, it may be common for computational reasons for all data inputs to be normalized. For inputting DPT test results to the ML model 120 or similar model, normalization may be achieved by converting a DPT test measurement (e.g., a TVM) to a fraction of a possible range of values for the particular property measured. This may involve setting a range from a minimum to maximum value and calculating the measured value as a fraction of the maximum minus the minimum. Normalization is a well-known computational operation, and not described further herein.

Figure 4:
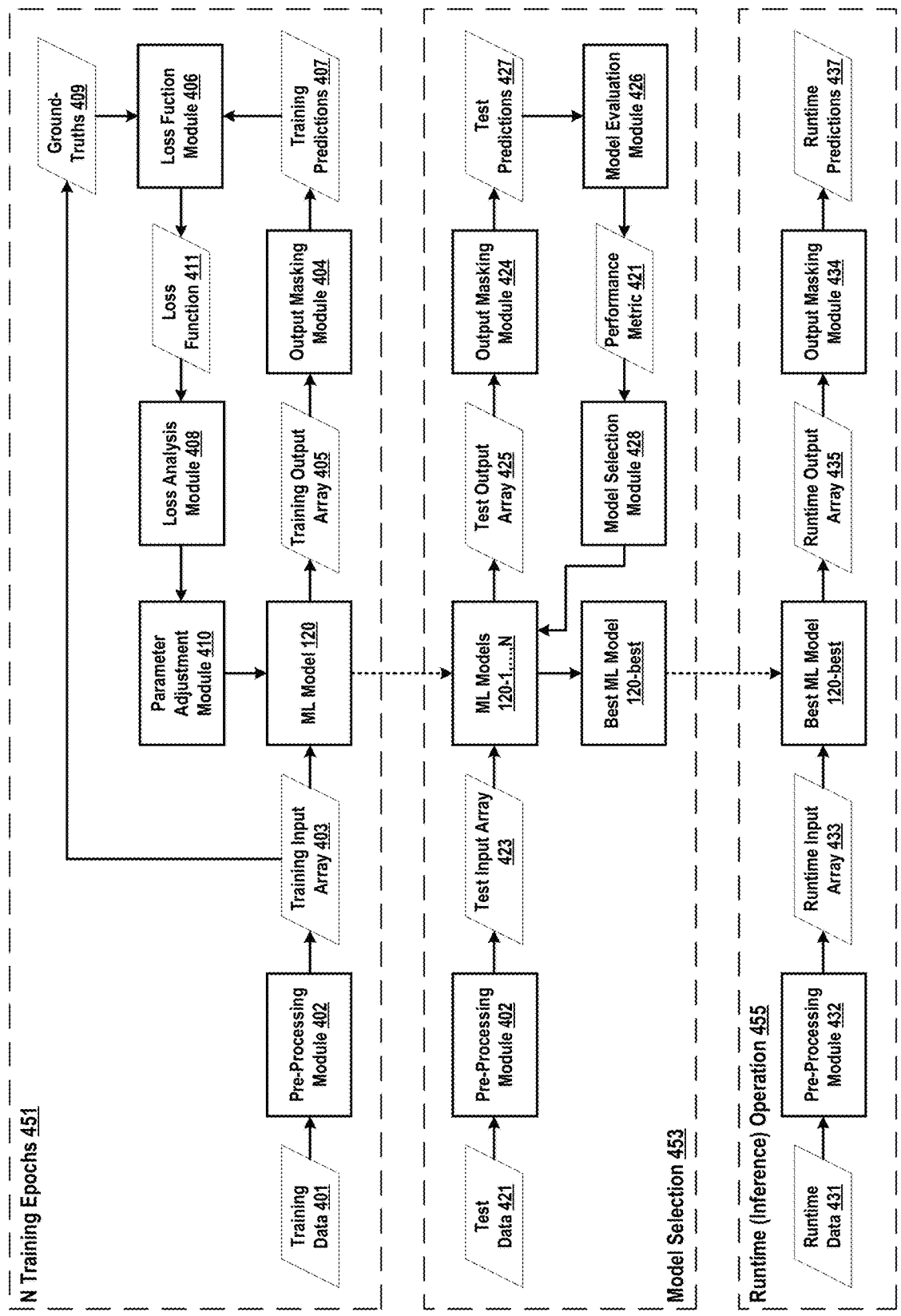
FIG. 4 is an example operational block diagram of aspects of a ML-based product testing system, in accordance with example embodiments.

FIG. 4 is an example operational block diagram of aspects of a ML-based product testing system 100, in accordance with example embodiments. In the illustration, example operation is carried out in three phases, shown within three dashed rectangles 451, 453, and 455. In the first phase 451, the ML model is trained within one or more training epochs using training data. In the second phase 453, possibly multiple versions of the trained model from the training epochs may be evaluated for a given metric, such as accuracy, using test data to select the best model for runtime operations. In some implementations and/or usage scenarios, the evaluation phase 453 may be optional. In this case, there may only be one training epoch, and the resulting trained model may be employed for runtime operations. In the third phase 455, the trained (and possibly further evaluated) ML model 120 may be applied as described in connection with the product testing system 100 of FIG. 1.

Further details of training, assessment, and inference are described below, first at a high level, then in more detail.

Model Training

As shown in FIG. 4, model training may be carried out within N training epochs, where N is a positive integer. Each training epoch is carried out over a corpus of training data that is made up of a set of training "test-result training records" or "TRSRs." Each TRSR may include a sequence of test results corresponding to a sequence of DPTs previously run on a given unit of a particular product, such as product 101. Thus, each test result of a TRSR includes a TVM and PFI from an actual test. A given TRSR may be unique among all TRSRs of the set of training TRSRs, both in terms of number and order of DPTs represented. In practice, however, there may be multiple TRSRs that are identical in number and order of DPTs, particularly if the total number of training TRSRs in the set exceeds the number of DPTs in the master set. Each TVM and PFI of a training TRSR may correspond to a unique instance of the prior executed DPT, even if there may be instances of identical test results from different DPT instances.

During each training epoch, a respective training iteration may be carried out over each training TRSR. For each training iteration, a training TRSR, designated as training data 401 in FIG. 4, is input to a pre-processing module 402, which normalizes the TVMs and generates a training input array 403. The training input array 403 may then be input into the ML model 120, which computes a training output array 405 that may include failure probabilities for all DPTs of the master set of DPTs. The training output array 405 is provided to an output masking module 404 that masks all output array elements corresponding to DPTs that are not part of the input TRSR. The result is a sub-array of training predictions 407.

The training input array may also include or have associated an array of ground-truths 409 corresponding to the PFIs associated with the test results of the input training TRSR. The ground-truths 409 and the training predictions 407 are input to a loss function module 406, which computes a loss function 411. A loss analysis module 408 then analyzes the loss function 411 to compute parameter adjustments, which may be used by a parameter adjustment module 410 to update the model.

While not necessarily evident from the illustration in FIG. 4, each training iteration over a given TRSR may be made up of successive sub-iterations carried out over each TVM of the training input array 403. More particularly, each sub-iteration presents to the inputs of the model the TVMs of a first segment of the sequence of TVMs, and uses the PFIs of the test results of a second segment of the sequence of TVMs as ground-truths, where the second segment follows the first in the sequence. The sub-iterations successively "march" through the training input array until the first segment corresponds to the entire sequence and second segment is depleted. Through these sub-iterations of each training TRSR, and through all training iterations over the set of training TRSRs, the ML model 120 may be trained to recognize a wide variety of DPT sequences and corresponding test results. In this way, the ML model 120 may thus be trained to predict probabilities of test failures of DPTs not yet carried out, based on test results of DPTs that have already been carried out in any number and/or order.

While each of the N training epochs 451 may be carried out over all training TRSRs of the set, the training epochs may differ in some way from one to the next in order to help avoid training the ML model 120 to just learn the patterns of only the set of training TRSRs. Non-limiting examples of how the training epochs may differ include different orders of the training TRSRs and/or different starting points in the list of training TRSRs. For some training scenarios, the N training epochs may be repeated, but with different initializations of the model (e.g., different starting parameters). In accordance with example embodiments, the N training epochs 451 may thus generate a set of trained models, designated ML models 120-1, . . . , N in FIG. 4, which may be evaluated for one or another form of model-performance metric that may then be used for model selection in a model evaluation phase.

Model Evaluation

In accordance with example embodiments, a model selection phase 453 may be used to evaluate the model-performance metrics of one or more of the trained models ML models 120-1, . . . , N from the training epochs 451, and to determine and select a best model for use in runtime (inference) operation. For example, the model-performance metric of each two or more trained models may be compared against a model-evaluation threshold, and the model that most exceeds the threshold may be selected as the best model. Non-limiting examples of a model-performance metric may include accuracy, precision, or some combination thereof. As shown in the model selection phase 453 in FIG. 4, test data 421 may be used in the evaluation process. The test data 421 may include test TRSRs similar to the set of training TRSRs, except that test TRSRs may be made up of previous test results that have not be used in the training epochs, and therefore has not been seen by any of the trained models from the training epochs.

During testing, test TRSRs may be input to the pre-processing module 402, which normalizes the TVMs and generates a test input array 423. The test input array 423 may then be input to any one or more of the ML models 120-1, ..., N, each of which may compute a test output array 425 that may include predicted failure probabilities for all DPTs of the master set of DPTs. The training output array 425 may be provided to the output masking module 424 that masks all output array elements corresponding to DPTs that are not part of the input test TRSR. The result is a sub-array of test predictions 427.

Although not explicitly illustrated in FIG. 4, the test input array 423 may also include or have associated an array of ground-truths corresponding to the PFIs associated with the test results of the input test TRSRs. The ground-truths and the training predictions 427 may be input to a model evaluation module 426, which computes a model-performance metric 421 for each model evaluated. A model selection module 428 may then analyze the model-performance metric 421 to determine which of the trained models ML models 120-1, ..., N has a model performance metric 421 that most exceeds a model-evaluation threshold, or may otherwise be deemed the "best" model, designated ML model 120-best in FIG. 4. Testing of the trained models ML models 120-1, ..., N may be carried out sequentially or in parallel.

Runtime (Inference) Prediction of Test Outcomes

In accordance with example embodiments, the ML model 120-best may then be used in runtime or inference operations 455 of the product test system 100. The runtime operations may be carried out for each of one or more product units under test. During runtime operation, runtime data 431 may be input to a pre-processing module 432, which may normalize the TVMs and generates a runtime input array 433. The runtime data 431 and the runtime input array 433 may include TVMs only for those tests of a runtime testing sequence that have already been run. These may include the results of a current test and all previous test (with respect to the current test) of the sequence. The runtime input array 433 may then be input to the ML model 120-best, which may compute a runtime output array 435 that may include predicted failure probabilities for all DPTs of the master set of DPTs. The runtime output array 435 may be provided to the output masking module 434 that masks all output array elements that do not correspond to future DPTs of the runtime testing sequence; i.e., those DPTs corresponding to test not yet run. The result is a sub-array of runtime predictions 437.

As described above, the runtime predictions 437 may be used to evaluate if and how testing should proceed. For example, if it is predicted that one or more of the future tests of the runtime testing sequence will fail with a probability exceeding one or more failure thresholds, testing of the particular product unit may be aborted or the testing sequence altered. Other action may be taken based on the runtime predictions 437.

D. Example Artificial Neural Network

Figure 5:
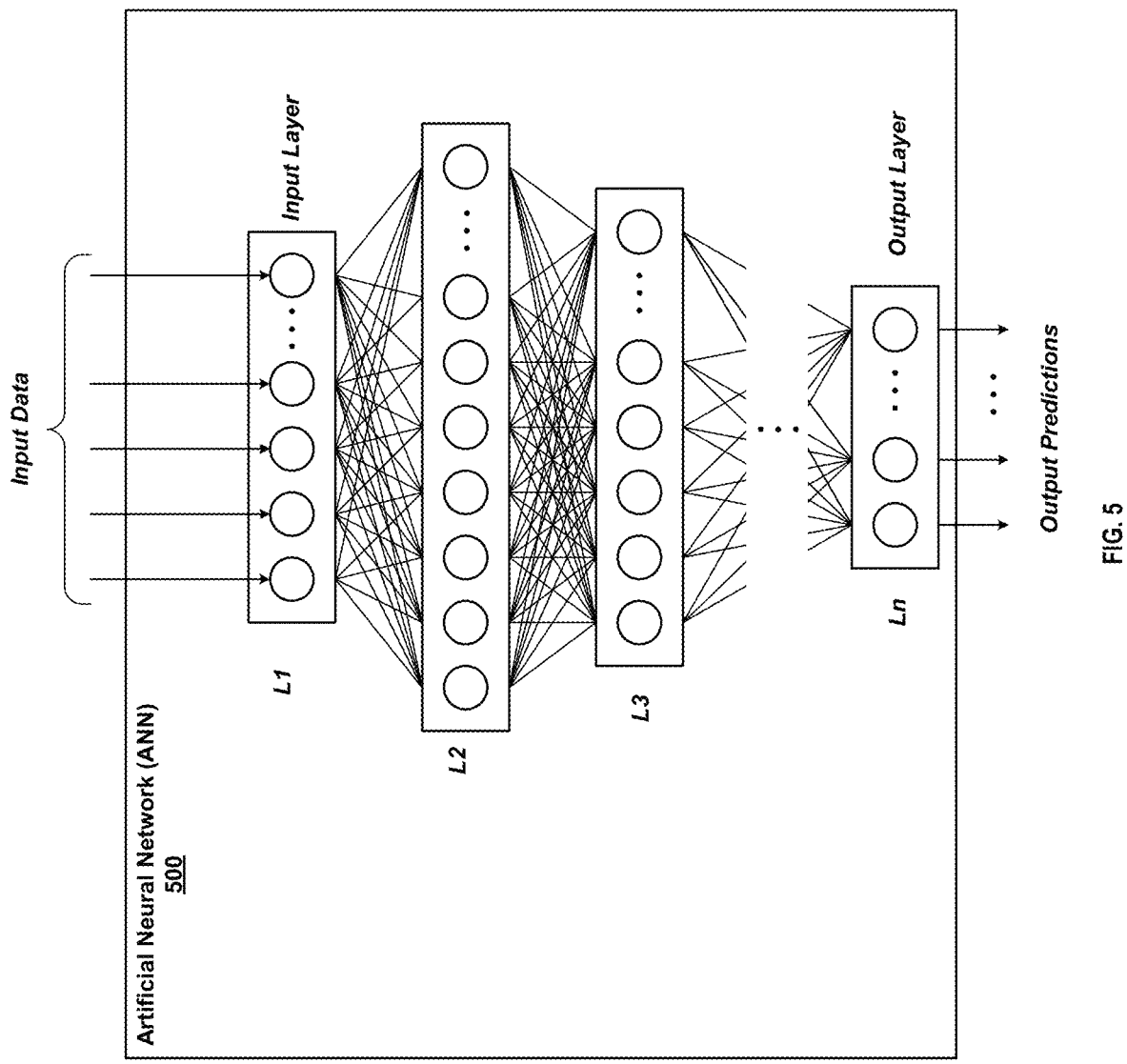
FIG. 5 is an example architecture of an example artificial neural network, in accordance with example embodiments.

As described above, a product testing system 100 may use one or more ANNs to compute predicted failure probabilities of future test of testing sequence. FIG. 5 illustrates an example architecture of an example artificial neural network 500, in accordance with example embodiments. As shown, the ANN 500 may be computationally constructed as a plurality of interconnected layers, including an input layer, labeled "L1"; an output layer, labeled "Ln"; and one or more intermediate layers, labeled "L2" and "L3" in this example. The ellipses between L3 and Ln represent one or more possible intermediate layers. In this example, there are n layers, with Ln labeling the nth layer. Each layer may be made up of one or more nodes having inputs and outputs. The inputs of nodes in one layer may be connected to the output of nodes of the preceding layer, except that the inputs to the nodes of the input layer receive input data, and the outputs of the nodes of the output layer provide a prediction that the input data matches one or another type of pattern that the ANN has been trained to recognize. Typically, training for recognition of a particular class of content in a given type of data, such as cats or dogs in image data, for example, may involve inputting training data that represents known or ground-truth (training) examples of the particular class of content for which results are known, and then adjusting parameters (or weights) of the nodes in an ANN learning update procedure, such as back propagation, to maximize a probability that a predicted output by the ANN output (e.g., what the ANN "thinks" the input data represents) matches the training examples.

Considering the ANN 500 as an implementation of an ML-based model, such as ML model 120, of a product testing system, such as product testing system 100, the input layer L1 may be configured with one input node for each possible DPT of a master set for a given particular product, for example. As such, a specific model may be configured for any given product and/or given testing regime for a given product. In some embodiments, the input layer may include one or more additional input nodes for any possible ancillary information that may be input to the model. For purposes of the discussion herein, it is generally sufficient to consider just the input nodes associated with TVMs.

As described above, the ML model 120 is trained to predict probabilities of failure (or, conversely, success) of future tests. During training, the ground-truth data are PFIs that are binary indicators of actual failure or success of previously executed product tests. In accordance with example embodiments, an ANN or other ML-based model that calculates probabilities may be evaluated and adjusted based on binary ground-truth data during training by an analytical technique involving binary cross-entropy/log loss. In particular, with binary cross-entropy/log loss, a loss function may be expressed as:

$$H_p(q) = -\frac{1}{N}\sum_{i=1}^{N} y_i \cdot \log(p(y_i)) + (1 - y_i) \cdot \log(1 - p(y_i)). \quad (1)$$

In equation (1), $y_i$, $=N$ are the ground-truth data, where $y_i$, $=1$ corresponds to a successful test and $y_i=0$ corresponds to a failed test. In this example formulation, p(y) corresponds to the probability of success, and 1−p(y) corresponds to the probability of failure. During training, the parameters of the ANN or other ML-based model may be adjusted to minimize the loss function over all of the $y_i$, i=1, ..., N. In some embodiments, other training and model adjustment techniques may be used. Using binary cross-entropy/log loss, among other possible techniques, may then yield a model having optimized parameters. The process may further involve achieving predicted probabilities that satisfy one or another threshold of statistical confidence.

For some types of applications in which an ANN is used, it may be configured to predict a probability or probabilities that a given input matches one or more elements or classes of elements of a known discrete set of elements or classes of elements. In this context, the ANN or the system in which it is implemented may be referred to as a "classifier," signifying a classification operation. A classifier may also be configured to make an actual selection from among a known discrete set of elements or classes of elements. For other types of applications in which an ANN is used, it may be configured to compute, given an input, a probable continuous value (e.g., a scalar) or set of values (e.g., a vector) as output, possibly together with confidence levels for the predicted output(s). In this context, the ANN or the system in which it is implemented may be considered as performing one or another form of regression analysis. Example embodiments of ML predictors described herein may include or employ either or both types of ANN implementations, in accordance with the descriptions herein. Further, other types of ANNs are possible, and may be used or included in example embodiments of ML model 120 described herein.

II. Example Model Training and Runtime Operations

As discussed above, test sequences may include any number of DPTs of a master set, and be arranged in any order. As also discussed, training iterations over training TRSRs involve sub-iterations over the test results of each TRSR. It is useful to consider training and runtime operations in more detail to understand how these operations are configured for processing varying sizes and orders of testing sequences.

Example Test-Result Training Records

FIGS. 6A and 6B illustrate a few different TRSRs by way of example. The top of FIG. 6A shows an example general structure of a TRSR 602 for a master set of M tests, T1, ..., T<M>, where M is an integer. As shown, the TRSR 602 may contain up to M test results, each corresponding to a different DPT, and each including a respective TVM and PFI. TRSRs may include other test information as well, but only TVMs and PFIs are discussed in detail in the examples below.

The bottom of FIG. 6A shows a possible TRSR 604 associated with an example master set of M=8 tests. By way of example, the TRSR 604 includes test results for all eight DPTs carried out in sequence order. Thus, TRSR 604 may correspond to a sequence test results of all eight DPTs that were carried out in order for testing a given unit of a particular product. Note that the TVMs and DPTs of TRSR 604 in the example do not display any actual values, but rather are just labeled by their respective sequence index. E.g., {(DPT1: (TVM1, PFI1)); (DPT2: (TVM2, PFI2)); ...; ((DPT8: TVM8, PFI8))}.

FIG. 6B illustrates four other example TRSRs for the master set of M=8. For illustrative purposes, and by way of example, measurement values are shown for each TVM and DPI. It should be understood that these values are listed for convenience in the following discussion, but are otherwise arbitrary. As shown, TRSR 606 includes all eight DPTs in order. TVM1 of DPT1 is 14.2, and the indicator of PFI1 is 1, indicating that the associated test passed (was successful). The TVM value 14.2 could be a measured voltage, for example. Other TVMs and PFIs are as shown.

The next example is TRSR 608, which includes test results for the testing sequence {DPT1, DPT2, DPT7, DPT4, DPT5}. TRSR 610 shows test results for the testing sequence {DPT2, DPT3, DPT8, DPT4}, and TRSR 612 shows test results for the testing sequence {DPT1, DPT3, DPT4, DPT8, DPT6, DPT7}. In accordance with example embodiments, training data for a ML-based model configured for testing a particular product using the master set of DPTs 1-8 may include the TRSRs 606, 608, 610, 612, as well as a possibly large number of other TRSRs with previous testing results.

Example Training Operation Details

FIGS. 7A-7E illustrate details of certain aspects of training iterations and sub-iterations. For purposes of discussion and by way of example, TRSR 610 is considered in the following description of training iterations and sub-iterations. There is no loss of generality by considering just one specific example TRSR.

Figure 7A:
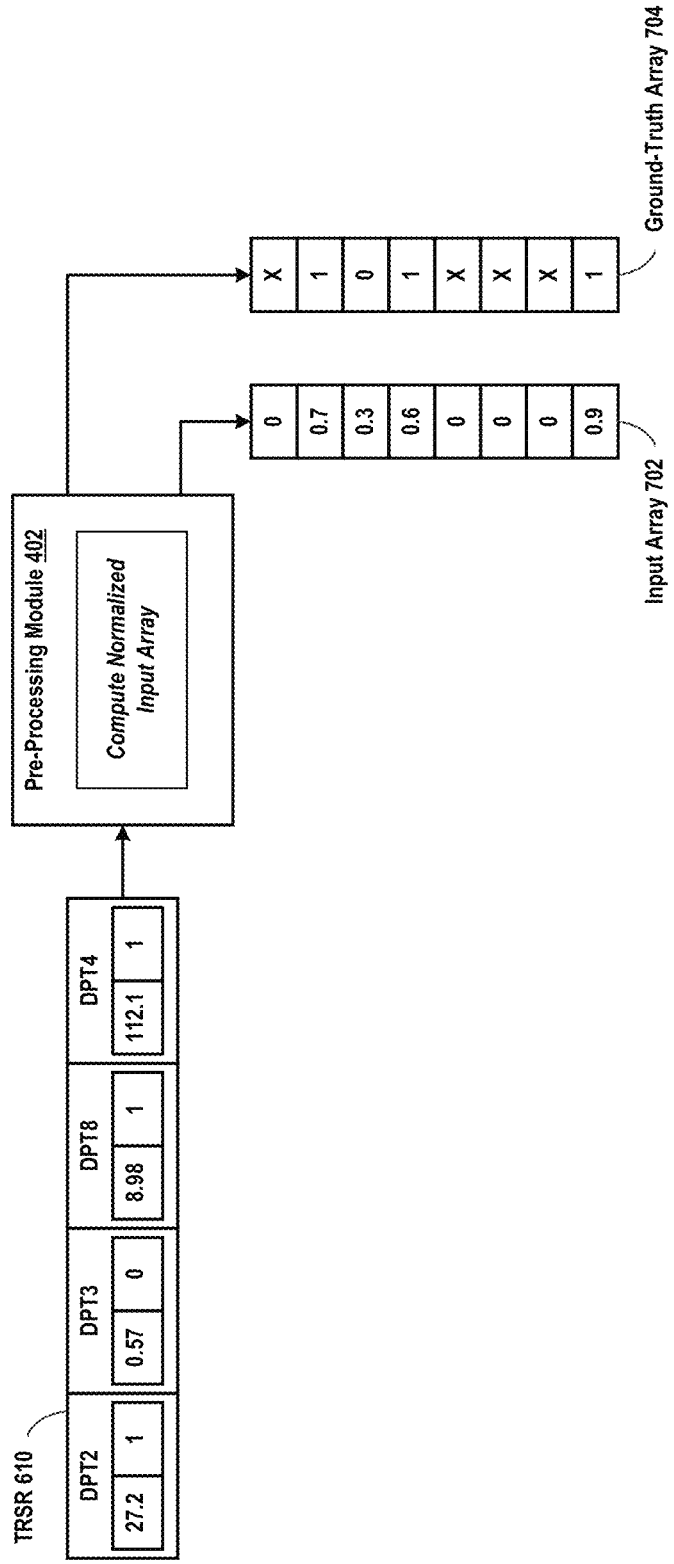

FIG. 7A first illustrates further details of the pre-processing of the training TRSR 610 in preparation for input to the ML model 120. As indicated, the pre-processing module 402 includes operations for normalizing the input TVMs and arranging the normalized measurement values in an input array 702. The pre-processing module may also extract the PFIs of the input TRSR and arrange them in a ground-truth array 704. In the input array 702, the normalized values occupy array locations corresponding to their sequence locations in the training TRSR 610. Similarly, in the ground-truth array 704, the PFIs also occupy array locations corresponding to their sequence locations in the training TRSR 610. As with the example TVM values depicted in the TRSR 610, the normalized values shown in the input array 702 are arbitrary example values for the illustrative purposes.

In accordance with example embodiments, input array locations corresponding to DPTs that are not included in the testing sequence of TRSR 610 are assigned a value of zero (0). Similarly, ground-truth array locations corresponding to DPTs that are not included in the testing sequence of TRSR 610 are designated with an "X" as shown. In the example of FIG. 7A, then, input array locations 2, 3, 8, and 4 are set to the respective normalized TVMs, while input array location 1, 5, 6, and 7 are set to zero (0). Similarly, ground-truth array locations 2, 3, 8, and 4 are set to the respective PFIs, while ground-truth array location 1, 5, 6, and 7 are set to "X."

Note that a value of zero (0) in the input array 702 may be used to signify an absence of test-result data. Thus the zero value in input array elements 1, 5, 6, and 7 signals to the ML model 120 that there are no test results for the correspond DPTs in the training TRSR 610. In the event that an actual test measurement has a normalized value of zero, the pre-processing operation may substitute a very small number to indicate that a valid but small (nearly zero) measurement is present. A non-limiting example of a small number for this purpose may be 10', though other small (or possibly special-valued) numbers could be used.

The pre-processing module 402 may also construct various masks that are applied during sub-iterations, as described below. Mask construction may be carried out in other manners and/or by other components. The forms of the masks are self-evident from the illustrations, and details of how they may be constructed and/or by what system component are omitted. Generally, a variety of computation steps or operations for mask construction may be devised.

FIG. 7B next illustrates the first training sub-iteration, designated "Sub-Iteration 1," with the input array 702. A sub-iteration mask 706-1 may be constructed to mask all input except the input corresponding to DPT2, which is the first test result of TRSR 610. Applying the sub-iteration mask 706-1 to the input array 702 results in a sub-iteration input array 708-1 in which every array element is zero except for the one corresponding to DPT2. The sub-iteration input array 708-1 is then input to the ML model 120, which generates a sub-iteration output array 710-1, which, in turn, includes a predicted failure probability for all DPTs of the master set, as shown. As with other example values, the predicted probability values are arbitrary, serving only as illustrations.

For the iteration input array 702 and the sub-iteration input array 708-1, the only predictions that are relevant are those for tests that are included in the TRSR 610 and that occurred after DPT2. Thus, a sub-iteration output mask 712-1 may be constructed to mask out any predicted probabilities of the sub-iteration output array 710-1 that are not relevant to the current sub-iteration 1. In this example case, only the predicted probabilities for DPT3, DPT8, and DPT4 are picked out by the sub-iteration output mask 712-1 and placed in an array of sub-iteration training predictions 714-1.

The sub-iteration training predictions 714-1 and the ground-truth array 704 are input to the loss function module, which computes the loss function 411-1 for this sub-iteration 1. Only the elements of the ground-truth array 704 that correspond to the relevant predictions are input to the loss function module 406. Thus, for sub-iteration 1, only the ground-truths corresponding PFI3, PFI8, and PFI4 are used. The ground-truth associated with DPT2, while present in the ground-truth array 704, may be ignored, as signified by a "X" blocking its input to the loss function module 406.

The loss function 411-1 may then be input to the loss analysis module 408, which adjusts model parameter to minimize the loss function. This could be done by applying equation (1) for example. However, other loss-minimization computations could be used. The adjusted model parameters may then be used by the parameter adjustment module 410 to update the model accordingly. The model adjustment may then complete the first sub-iteration, setting up the model for the next sub-iteration.

FIG. 7C next illustrates the second training sub-iteration, designated "Sub-Iteration-2," with the input array 702. A sub-iteration mask 706-2 may be constructed to mask all input except the inputs corresponding to DPT2 and DPT3, which are the first and second test results, in sequence order, of TRSR 610. Applying the sub-iteration mask 706-2 to the input array 702 results in a sub-iteration input array 708-2 in which every array element is zero except for the two corresponding to DPT2 and DPT3. The sub-iteration input array 708-2 is then input to the ML model 120, which generates a sub-iteration output array 710-2, which again includes a predicted failure probability for all DPTs of the master set, as shown. As with other example values, the predicted probability values are arbitrary, serving only as illustrations.

For the iteration input array 702 and the sub-iteration input array 708-2, the only predictions that are relevant are those for tests that are included in the TRSR 610 and that occurred after DPT2 and DPT3. Thus, a sub-iteration output mask 712-2 may be constructed to mask out any predicted probabilities of the sub-iteration output array 710-2 that are not relevant to the current sub-iteration 2. In this example case, only the predicted probabilities for DPT8 and DPT4 are picked out by the sub-iteration output mask 712-2 and placed in an array of sub-iteration training predictions 714-2.

The sub-iteration training predictions 714-2 and the ground-truth array 704 are input to the loss function module, which computes the loss function 411-2 for this sub-iteration 2. Only the elements of the ground-truth array 704 that correspond to the relevant predictions are input to the loss function module 406. Thus, for sub-iteration 2, only the ground-truths corresponding PFI8 and PFI4 are used. The ground-truths associated with DPT2 and DPT3, while present in the ground-truth array 704, may be ignored, as signified by "X"s blocking their input to the loss function module 406.

The loss function 411-2 may then be input to the loss analysis module 408, which adjusts model parameters to minimize the loss function. Again, this could be done by applying equation (1) for example. However, other loss-minimization computations could be used. The adjusted model parameters may then be used by the parameter adjustment module 410 to update the model accordingly. The model adjustment may then complete the second sub-iteration, setting up the model for the next sub-iteration.

Figures 7D, 7E:
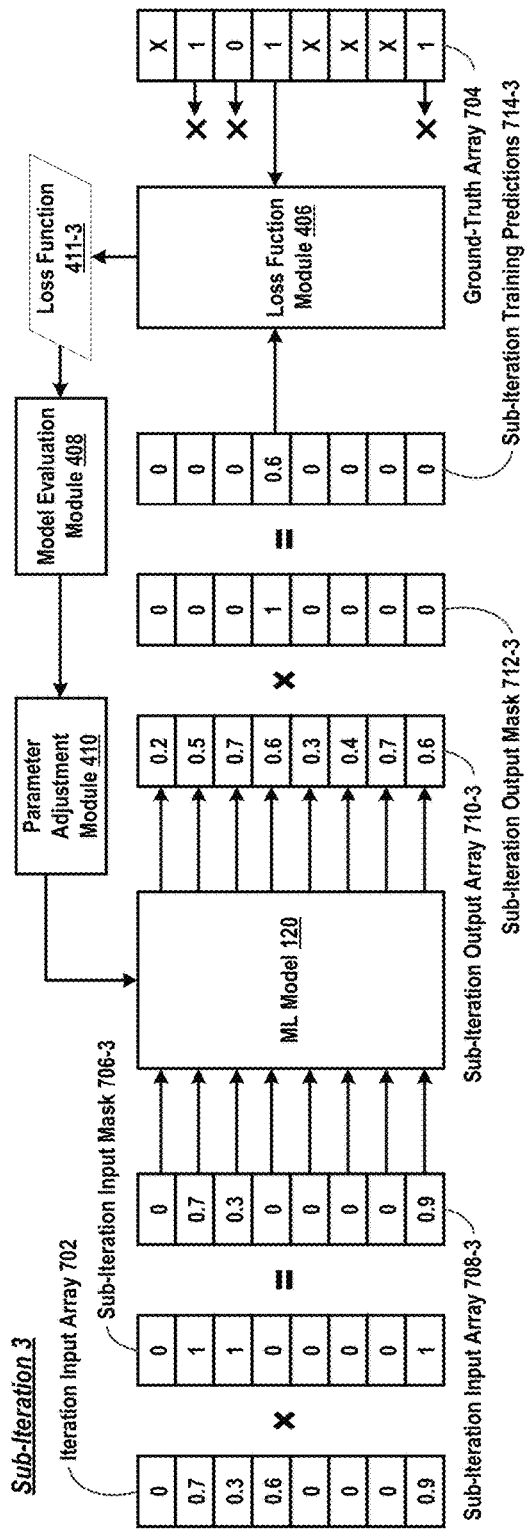

FIG. 7D next illustrates the third training sub-iteration, designated "Sub-Iteration-3," with the input array 702. A sub-iteration mask 706-3 may be constructed to mask all input except the inputs corresponding to DPT2, DPT3, and DPT8, which are the first, second, and third test results, in sequence order, of TRSR 610. Applying the sub-iteration mask 706-3 to the input array 702 results in a sub-iteration input array 708-3 in which every array element is zero except for the three corresponding to DPT2, DPT3, and DPT8. The sub-iteration input array 708-3 is then input to the ML model 120, which generates a sub-iteration output array 710-3, which again includes a predicted failure probability for all DPTs of the master set, as shown. As with other example values, the predicted probability values are arbitrary, serving only as illustrations.

For the iteration input array 702 and the sub-iteration input array 708-3, the only predictions that are relevant are those for tests that are included in the TRSR 610 and that occurred after DPT2, DPT3, and DPT8. Thus, a sub-iteration output mask 712-3 may be constructed to mask out any predicted probabilities of the sub-iteration output array 710-3 that are not relevant to the current sub-iteration 3. In this example case, only the predicted probability for DPT4 is picked out by the sub-iteration output mask 712-3 and placed in an array of sub-iteration training predictions 714-3.

The sub-iteration training prediction 714-3 and the ground-truth array 704 are input to the loss function module, which computes the loss function 411-3 for this sub-iteration 3. Only the elements of the ground-truth array 704 that correspond to the relevant predictions are input to the loss function module 406. Thus, for sub-iteration 3, only the ground-truths corresponding PFI4 are used. The ground-truths associated with DPT2, DPT3 and DPT8, while present in the ground-truth array 704, may be ignored, as signified by "X"s blocking their input to the loss function module 406.

The loss function 411-3 may then be input to the loss analysis module 408, which adjusts model parameters to minimize the loss function. Again, this could be done by applying equation (1) for example. However, other loss-minimization computations could be used. The adjusted model parameters may then be used by the parameter adjustment module 410 to update the model accordingly. The model adjustment may then complete the second sub-iteration, setting up the model for the next sub-iteration.

After the adjustments for sub-iteration 3, the next sub-iteration 4 will input all the test results for the TRSR 610. In this case, none of the output predictions will correspond to a test that was completed after all of the inputs, since the inputs will now account for all tests that were completed in generating TRSR 610. Thus, the sub-iteration 4 may produce predicted probabilities, but they may not necessarily contribute to any further parameter adjustment during the training iteration associated with TRSR 610. In this case, a last sub-iteration involving inputting all test results of TRSR 610 may not necessarily be carried out at all, and may be deemed optional. For completeness, however, an example of the sub-iteration 4, if it is carried out, may proceed as follows.

FIG. 7E finally illustrates a possible (e.g., optional) fourth training sub-iteration, designated "Sub-Iteration-4," with the input array 702. A sub-iteration mask 706-4 may be constructed to mask all input except the inputs corresponding to DPT2, DPT3, DPT8, and DPT4, which are the first, second, third, and fourth test results, in sequence order, of TRSR 610; that is, all of the test results of TRSR 610. Applying the sub-iteration mask 706-4 to the input array 702 results in a sub-iteration input array 708-4 in which every array element is zero except for the four corresponding to DPT2, DPT3, DPT8, and DPT4. The sub-iteration input array 708-4 is then input to the ML model 120, which generates a sub-iteration output array 710-4, which again includes a predicted failure probability for all DPTs of the master set, as shown. As with other example values, the predicted probability values are arbitrary, serving only as illustrations.

For the iteration input array 702 and the sub-iteration input array 708-4, there are no tests results from tests that occurred after DPT2, DPT3, DPT8, and DPT4. In this case, instead of constructing a sub-iteration output mask that (if the procedures of the first three iterations were followed) contains all zeros, an "optional" sub-iteration output mask 712-4 may be constructed to mask out any predicted probabilities of the sub-iteration output array 710-4 that are not relevant to the current sub-iteration 4. As indicated by the dashed rectangle in FIG. 7E, in this example case, all the predicted probabilities for DPT2, DPT3, DPT8, and DPT4 are picked out by the optional sub-iteration output mask 712-4 and placed in an array of sub-iteration training predictions 714-4. As noted, there may not be any further model adjustments from this sub-iteration, since model adjustments are intended for comparing predicted failure probabilities for tests after the input test with the corresponding PFIs. And as noted, there are no tests that come after the full sequence in the TRSR 610. Nevertheless, the sub-iteration training predictions 714-4 may still be computed, and possibly used in an alternative parameter adjustment or some other purpose, for example.

In accordance with example embodiments, the sub-iterations illustrated for the TRSR 610 may be carried out for all training TRSRs of the training data. As described, all such iterations may constitute a training epoch. Multiple training epochs may be carried out over the set of training TRSRs by altering the order and/or starting point of the iterations within the set. Additionally or alternatively, each training epoch may start with different initial values for model parameters. Once all training epochs are complete, a best model may be determined as described above in connection with the model selection phase 453 of FIG. 4. With a best model selected, the product testing system 100 may be configured for runtime (inference) operations by implementing the selected model in the system. Details of runtime operation are described next.

Example Runtime (Inference) Operation Details

As described in connection with FIG. 1, runtime operation may involve creating a runtime test sequence from a master set of DPTs, then applying that sequence to actual testing of a given unit of a particular product. After each given test of the runtime test sequence is completed, the results of the given test and any that preceded it in the sequence are input to the trained ML model 120, which computes predicted failure probabilities for any remaining tests of the runtime test sequence. The product testing system 100 then facilitates evaluation of the predicted probabilities, and possible test-control actions based on the evaluation. For example, testing may be aborted if the predicted probability for one or more future tests exceeds one or more failure thresholds.

FIGS. 8A-8E illustrate details of certain aspects of runtime operations carried out on just one unit of a particular product, with some references to FIG. 1. For purposes of discussion and by way of example, an example runtime test sequence 801 is considered in the following description of runtime (inference) operations. There is no loss of generality by considering just one specific example runtime test sequence, or just one unit of a particular product.

FIG. 8A first illustrates the example runtime test sequence 801. For illustrative purposes, the runtime test sequence 801 is assumed to be constructed of DPTs from the master set of M=8 DPTs. By way of example, the runtime test sequence 801 is {DPT1, DPT2, DPT5, DPT3, DPT6}. This testing sequence corresponds to a planned sequence for testing one or more units of a particular product. For purposes of illustration, a particular unit product 101 is taken to be the product under test.

As with training, certain runtime operations involve applying one or another form of mask. Again, mask construction may be carried out in a variety of manners and/or by a variety of system components. The forms of the runtime masks are self-evident from the illustrations, and details of how they may be constructed and/or by what system component are omitted. Generally, a variety of computation steps or operations for mask construction may be devised.

FIG. 8B next illustrates certain operations involved in carrying out DPT1, the first test of the runtime sequence 801. An identifier of DPT1 may be input to the test controller 114, which may cause DPT1 to be carried out on product 101 by the testing equipment 106 and product testbed 104, as shown. The test monitor 116 may monitor and receive test results for DPT1 from the testing equipment 106, and input those results to the pre-processing module 432 of FIG. 4, for example.

The pre-processing module 432 may store and/or record the current test results with any previous test results in current+past test results 105, which may be one or another form of memory or storage, such as volatile or non-volatile memory or database, for example. Then, the current and any past (previous) test results may be normalized and placed in sequence order in a runtime input array 802-1. For this first test, DPT1, there are no previous test results, so only the first array element of the runtime input array 802-1 is populated with the normalized test result for DPT1. This element is depicted with a thick, black rectangular border as a visual cue indicating that it is the most recent test result. As with previous example measurement values, the value of 0.7 shown is illustrative, but otherwise arbitrary.

The runtime input array 802-1 may then be input to the trained ML model 120, which generates a runtime output array 804-1, which, in turn, includes a predicted failure probability for all DPTs of the master set, as shown. As with other example values, the predicted probability values are arbitrary, serving only as illustrations.

For the runtime input array 802-1, the only predictions that are relevant are those for tests after DPT1 in the runtime test sequence 801. Thus, a runtime output mask 806-1 may be constructed to mask out any predicted probabilities of the runtime output array 804-1 that are not relevant to the current test pass on DPT1. In this example case, only the predicted probabilities for DPT2, DPT5, DPT3, and DPT6 are picked out by the runtime output mask 806-1 and placed in an array of future test failure probabilities 808-1. For illustrative purposes, the mask elements and the future test failure probabilities associated with tests that are not included in the runtime testing sequence 801—DPT4, DPT7, and DPT8 in this example—are each marked with an "X" to signify their omission from the runtime testing sequence.

The future test failure probabilities 808-1 array is then input to the analysis module 110, which provides results to the test flow decider module 112. Example results may be a comparison of the failure probabilities in future test failure probabilities 808-1 with respective failure threshold. Based on the results a decision may then be made as to whether to continue testing or abort testing. Other decisions could be made, such as changing the testing order of the remaining tests. For illustrative purposes, it is assumed that a decision to proceed to the next test of the runtime test sequence 801, DPT2, is made. This completes the runtime operations of the first test pass on DPT1.

FIG. 8C next illustrates certain operations involved in carrying out DPT2, the second test of the runtime sequence 801. An identifier of DPT2 may be input to the test controller 114, which may cause DPT2 to be carried out on product 101 by the testing equipment 106 and product testbed 104, as shown. The test monitor 116 may monitor and receive test results for DPT2 from the testing equipment 106, and input those results to the pre-processing module 432 of FIG. 4, for example.

The pre-processing module 432 may store and/or record the current test results with any previous test results in current+past test results 105. Then, the current and any past (previous) test results may be normalized and placed in sequence order in a runtime input array 802-2. For this second test, DPT2, the previous test results include just DPT1, so the first array element of the runtime input array 802-2 is populated with the normalized previous test result for DPT1, and the second array element of the runtime input array 802-2 is populated with the normalized current test result for DPT2. This element for DPT2 is depicted with a thick, black rectangular border as a visual cue indicating that it is the most recent test result, while a dashed input arrow to the element for DPT1 is a visual cue that DPT1 is a previous result. Again, example measurement values are illustrative, but otherwise arbitrary.

The runtime input array 802-2 may then be input to the trained ML model 120, which generates a runtime output array 804-2, which, in turn, includes a predicted failure probability for all DPTs of the master set, as shown. As with other example values, the predicted probability values are arbitrary, serving only as illustrations.

For the runtime input array 802-2, the only predictions that are relevant are those for tests after DPT1 and DPT2 in the runtime test sequence 801. Thus, a runtime output mask 806-2 may be constructed to mask out any predicted probabilities of the runtime output array 804-2 that are not relevant to the current test pass on DPT2. In this example case, only the predicted probabilities for DPT5, DPT3, and DPT6 are picked out by the runtime output mask 806-2 and placed in an array of future test failure probabilities 808-2. Again, the mask elements and the future test failure probabilities associated DPT4, DPT7, and DPT8 are each marked with an "X" to signify their omission from the runtime testing sequence.

The future test failure probabilities 808-2 array is then input to the analysis module 110, which provides results to the test flow decider module 112. Example results may be a comparison of the failure probabilities in future test failure probabilities 808-2 with respective failure threshold. Based on the results a decision may then be made as to whether to continue testing or abort testing. Again, other decisions could be made, such as changing the testing order of the remaining tests. For illustrative purposes, it is assumed that a decision to proceed to the next test of the runtime test sequence 801, DPT5, is made. This completes the runtime operations of the second test pass on DPT2.

FIG. 8D next illustrates certain operations involved in carrying out DPT5, the third test of the runtime sequence 801. An identifier of DPT5 may be input to the test controller 114, which may cause DPT5 to be carried out on product 101 by the testing equipment 106 and product testbed 104, as shown. The test monitor 116 may monitor and receive test results for DPT5 from the testing equipment 106, and input those results to the pre-processing module 432 of FIG. 4, for example.

The pre-processing module 432 may store and/or record the current test results with any previous test results in current+past test results 105. Then, the current and any past (previous) test results may be normalized and placed in sequence order in a runtime input array 802-3. For this third test, DPT5, the previous test results include DPT1 and DPT2, so the first and second array elements of the runtime input array 802-3 are populated with the normalized previous test results for DPT1 and DPT2, and the fifth array element of the runtime input array 802-3 is populated with the normalized current test result for DPT5. This element for DPT5 is depicted with a thick, black rectangular border as a visual cue indicating that it is the most recent test result, while dashed input arrows to the elements for DPT1 and DPT2 are visual cues that DPT1 and DPT2 are previous results. Again, example measurement values are illustrative, but otherwise arbitrary.

The runtime input array 802-3 may then be input to the trained ML model 120, which generates a runtime output array 804-3, which, in turn, includes a predicted failure probability for all DPTs of the master set, as shown. As with other example values, the predicted probability values are arbitrary, serving only as illustrations.

For the runtime input array 802-3, the only predictions that are relevant are those for tests after DPT1, DPT2, and DPT5 in the runtime test sequence 801. Thus, a runtime output mask 806-3 may be constructed to mask out any predicted probabilities of the runtime output array 804-3 that are not relevant to the current test pass on DPT5. In this example case, only the predicted probabilities for DPT3 and DPT6 are picked out by the runtime output mask 806-3 and placed in an array of future test failure probabilities 808-3. Once more, the mask elements and the future test failure probabilities associated DPT4, DPT7, and DPT8 are each marked with an "X" to signify their omission from the runtime testing sequence.

The future test failure probabilities 808-3 array is then input to the analysis module 110, which provides results to the test flow decider module 112. Example results may be a comparison of the failure probabilities in future test failure probabilities 808-3 with respective failure threshold. Based on the results a decision may then be made as to whether to continue testing or abort testing. Again, other decisions could be made, such as changing the testing order of the remaining tests. For illustrative purposes, it is assumed that a decision to proceed to the next test of the runtime test sequence 801, DPT3, is made. This completes the runtime operations of the third test pass on DPT5.

FIG. 8E next illustrates certain operations involved in carrying out DPT3, the fourth test of the runtime sequence 801. An identifier of DPT3 may be input to the test controller 114, which may cause DPT3 to be carried out on product 101 by the testing equipment 106 and product testbed 104, as shown. The test monitor 116 may monitor and receive test results for DPT3 from the testing equipment 106, and input those results to the pre-processing module 432 of FIG. 4, for example.

The pre-processing module 432 may store and/or record the current test results with any previous test results in current+past test results 105. Then, the current and any past (previous) test results may be normalized and placed in sequence order in a runtime input array 802-4. For this fourth test, DPT3, the previous test results include DPT1, DPT2, and DPT5, so the first, second and fifth array elements of the runtime input array 802-4 are populated with the normalized previous test results for DPT1, DPT2, and DPT5, and the third array element of the runtime input array 802-4 is populated with the normalized current test result for DPT3. This element for DPT3 is depicted with a thick, black rectangular border as a visual cue indicating that it is the most recent test result, while dashed input arrows to the elements for DPT1, DPT2, and DPT5 are visual cues that DPT1, DPT2, and DPT5 are previous results. Again, example measurement values are illustrative, but otherwise arbitrary.

The runtime input array 802-4 may then be input to the trained ML model 120, which generates a runtime output array 804-4, which, in turn, includes a predicted failure probability for all DPTs of the master set, as shown. As with other example values, the predicted probability values are arbitrary, serving only as illustrations.

For the runtime input array 802-4, the only predictions that are relevant are those for tests after DPT1, DPT2, DPT5, and DPT3 in the runtime test sequence 801. Thus, a runtime output mask 806-4 may be constructed to mask out any predicted probabilities of the runtime output array 804-4 that are not relevant to the current test pass on DPT3. In this example case, only the predicted probability for DPT6 is picked out by the runtime output mask 806-4 and placed in an array of future test failure probabilities 808-4. Once again, the mask elements and the future test failure probabilities associated DPT4, DPT7, and DPT8 are each marked with an "X" to signify their omission from the runtime testing sequence.

The future test failure probabilities 808-4 array is then input to the analysis module 110, which provides results to the test flow decider module 112. Example results may be a comparison of the failure probabilities in future test failure probabilities 808-4 with respective failure threshold. Based on the results a decision may then be made as to whether to continue testing or abort testing. Again, other decisions could be made, such as changing the testing order of the remaining tests. For illustrative purposes, it is assumed in this case that a decision is made to abort testing and not proceed to the next test of the runtime test sequence 801. This completes the runtime operations of the fourth test pass on DPT5, and illustrates an example of altering (e.g., aborting) future testing based on predicted failure probabilities.

III. Example Methods

Figure 9:
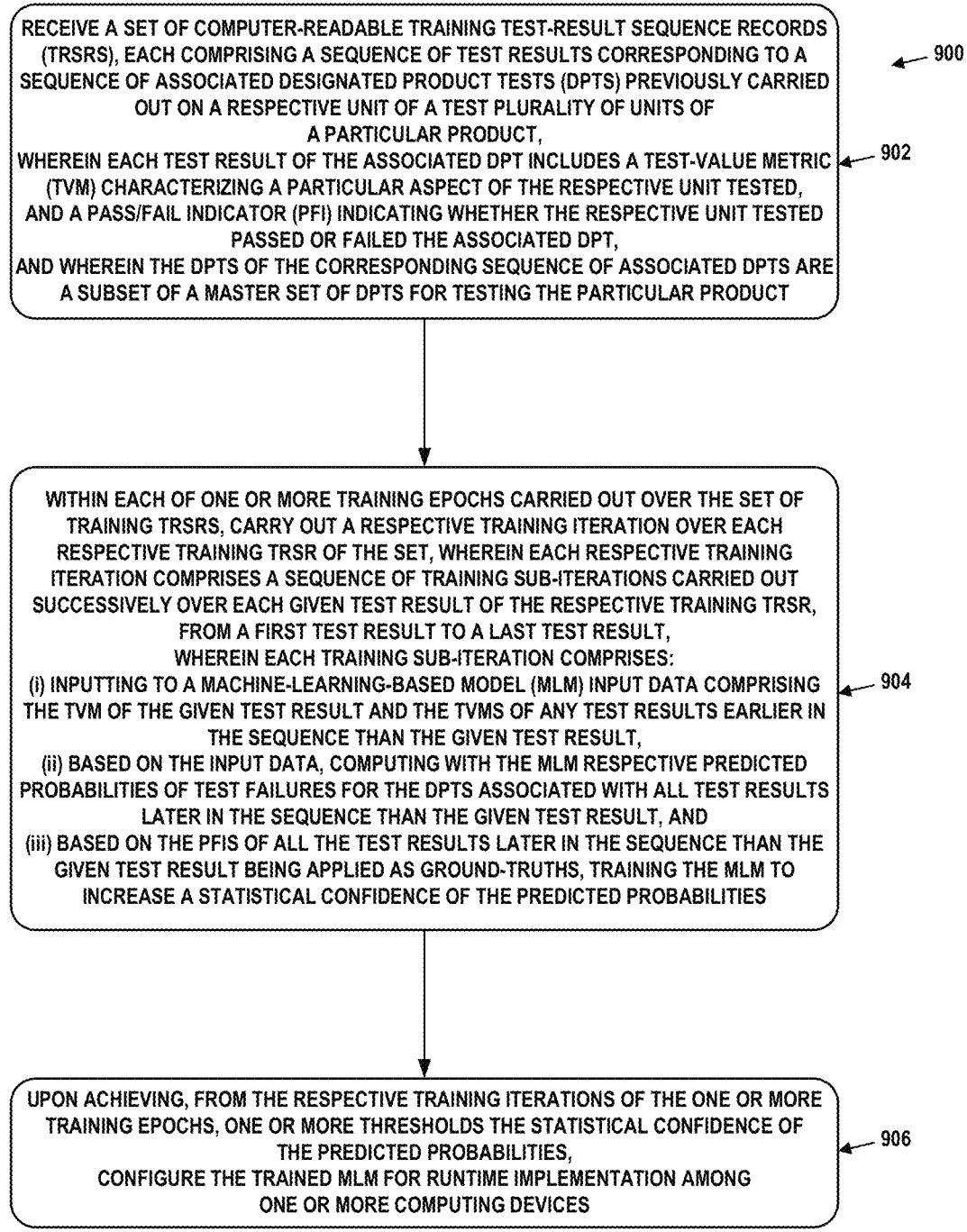
FIG. 9 is a flow chart of an example method, in accordance with example embodiments.
Figure 10:
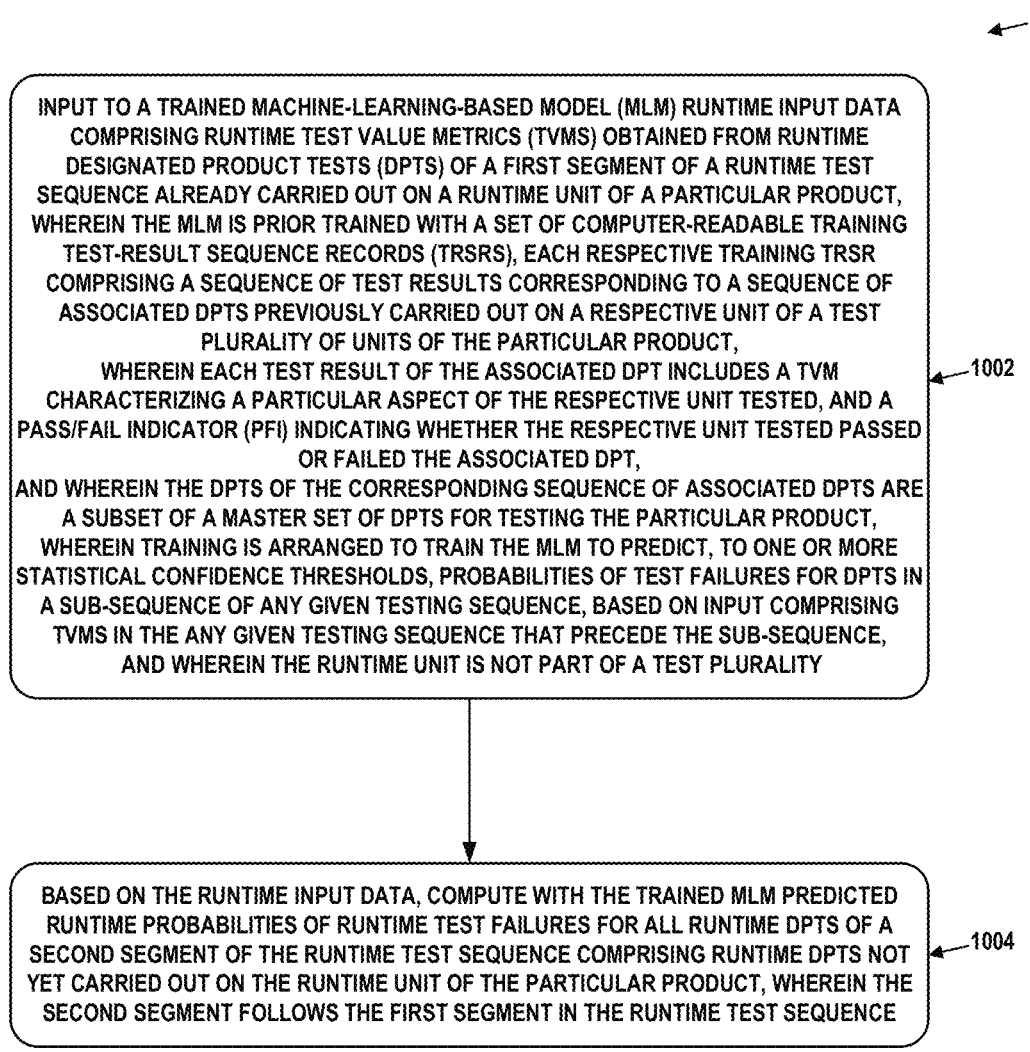
FIG. 10 is a flow chart of another example method, in accordance with example embodiments.

FIGS. 9 and 10 are flows chart illustrating a respective example embodiments of a methods 900 and 1000. The methods illustrated by FIGS. 9 and 10 may both be carried out by a computing system or computing device that includes a computational implementation of a machine-learning-based model (MLM) configured for predicting failure probabilities of product tests scheduled in a future segment of a testing sequence based on test outcomes of different product tests completed during a prior segment of the testing sequence. Non-limiting examples of the computing system computing system or computing device include computing device 200 or server cluster 304, for example. However, the method can be carried out by other types of devices or device subsystems. For example, the process could be carried out by a portable computer, such as a laptop or a tablet device. A MLM could also be implemented as part of a product testing system, such product testing system 100, for example.

The embodiments of FIGS. 900 and 1000 may be simplified by the removal of any one or more of the features shown therein. Further, these embodiments may be combined with features, aspects, and/or implementations of any of the previous figures or otherwise described herein.

The example methods 900 and 1000 may also be embodied as instructions executable by one or more processors of the one or more server devices of the system or virtual machine or container. For example, the instructions may take the form of software and/or hardware and/or firmware instructions. In an example embodiment, the instructions may be stored on a non-transitory computer readable medium. When executed by one or more processors of the one or more servers, the instructions may cause the one or more servers to carry out various operations of the example method.

Example method 900 is described first.

Block 902 of example method 900 may involve receiving a set of computer-readable training test-result sequence records (TRSRs), where each respective training TRSR may include a sequence of test results corresponding to a sequence of associated designated product tests (DPTs) previously carried out on a respective unit of a test plurality of units of a particular product. Each test result of the associated DPT may include a test-value metric (TVM) characterizing a particular aspect of the respective unit tested, and a pass/fail indicator (PFI) indicating whether the respective unit tested passed or failed the associated DPT. For example, a PFI set to zero may indicate test failure, and a PFI set to one may indicate testing success. The DPTs of the corresponding sequence of associated DPTs may be a subset of a master set of DPTs for testing the particular product.

Block 904 of example method 900 may involve each of one or more training epochs carried out over the set of training TRSRs. More particularly, within each of the one or more training epochs, a respective training iteration may be carried out over each respective training TRSR of the set. Each respective training iteration may include a sequence of training sub-iterations carried out successively over each given test result of the respective training TRSR, from a first test result to a last test result. Each training sub-iteration may include: (i) inputting to the MLM input data that may include the TVM of the given test result and the TVMs of any test results earlier in the sequence than the given test result, (ii) based on the input data, computing with the MLM respective predicted probabilities of test failures for the DPTs associated with all test results later in the sequence than the given test result, and (iii) based on the PFIs of all the test results later in the sequence than the given test result being applied as ground-truths, training the MLM to increase a statistical confidence of the predicted probabilities.

Finally, block 906 of example method 900 may involve, upon achieving, from the respective training iterations of the one or more training epochs, one or more thresholds of the statistical confidence of the predicted probabilities, configuring the trained MLM for runtime implementation among one or more computing devices.

In accordance with example embodiments, the MLM may be configured to receive as input TVMs corresponding to all the DPTs of the master set of DPTs. Inputting to the MLM the input data that includes the TVM of the given test result and the TVMs of any test results earlier in the sequence than the given test result may involve masking, on input, the TVMs of all the test results later in the sequence than the given test result. It may also involve masking, on input, the TVMs corresponding to all the DPTs of the master set of DPTs that are not part of the sequence of DPTs.

In accordance with example embodiments, each PFI may be a binary value. Then, training the MLM to increase the statistical confidence of the predicted probabilities based on the PFIs of all the test results later in the sequence than the given test result being applied as ground-truths may involve applying binary cross-entropy/log loss to compute and minimize a loss function that models loss in terms of a probability distribution of the PFIs of all the test results later in the sequence than the given test result. An example of a binary cross-entropy/log loss function is shown in equation (1).

In accordance with example embodiments, the MLM may be or include an artificial neural network.

In accordance with example embodiments, each of the one or more training epochs may differ from one another by an order in which the training iterations are carried out over the set of training TRSRs. In some examples, the one or more training epochs may be repeated, but with different initialization values of at least some parameters of the MLM.

In accordance with example embodiments, when two or more training epochs are carried out, configuring the trained MLM for runtime implementation among one or more computing devices may involve determining which of the two or more training epochs yields a trained MLM having a model-performance metric that most exceeds a model-evaluation threshold. This may involve evaluating the trained MLMs from the two or more training epochs for respective model-performance metrics, and comparing them to the model-evaluation threshold. Non-limiting examples of model-performance metric include accuracy, precision, and/or some combination thereof.

In accordance with example embodiments, the example method 900 may further involve inputting to the trained MLM runtime input data comprising runtime TVMs obtained from runtime DPTs of a first segment of a runtime test sequence already carried out on a runtime unit of the particular product, where the runtime unit is not part of the test plurality. Then, based on the runtime input data, the trained MLM may be applied to compute predicted runtime probabilities of runtime test failures for all runtime DPTs of a second segment of the runtime test sequence that includes runtime DPTs not yet carried out on the runtime unit of the particular product. In this arrangement, the second segment follows the first segment in the runtime test sequence.

In accordance with example embodiments, the example method 900 may further involve making a comparison of each of one or more of the predicted runtime probabilities against a respective failure threshold, and determining whether or not to carry out at least one runtime DPT of the second segment on the runtime unit of the particular product based on at least one of the comparisons.

In further accordance with example embodiments, a first runtime DPT of the second segment of the runtime test sequence may immediately follow a last runtime DPT of the first segment of the runtime test sequence. With this arrangement, the example method 900 may further involve carrying out the first runtime DPT of the second segment on the runtime unit of the particular product, based on a determination that the predicted runtime probability of failure of the first runtime DPT of the second segment is below a failure threshold. Then, the trained MLM may receive as input updated runtime input data that includes both the runtime TVMs obtained from runtime DPTs of the first segment, and a runtime TVM obtained from the first runtime DPT of the second segment. Based on the updated runtime input data, trained MLM may compute updated predicted runtime probabilities of runtime test failures for all runtime DPTs of the second segment except for the first runtime DPT of the second segment.

Example method 1000 is described next.

Example method 1000 may involve runtime operation of a product testing system that includes a trained machine-learning-based model (MLM). In accordance with example embodiments, the MLM may be trained with a set of computer-readable training test-result sequence records (TRSRs), Each respective training TRSR may include a sequence of test results corresponding to a sequence of associated designated product tests (DPTs) previously carried out on a respective unit of a test plurality of units of a particular product. Each test result of the associated DPT may include a test-value metric (TVM) characterizing a particular aspect of the respective unit tested, and a pass/fail indicator (PFI) indicating whether the respective unit tested passed or failed the associated DPT. Further, the DPTs of the corresponding sequence of associated DPTs may be a subset of a master set of DPTs for testing the particular product.

In further accordance with example embodiments, training may be arranged to train the MLM to predict, to one or more accuracy thresholds, probabilities of test failures for DPTs in a sub-sequence of any given testing sequence, based on input comprising TVMs in the any given testing sequence that precede the sub-sequence.

Block 1002 of example method 1000 may involve inputting to the trained MLM runtime input data including runtime TVMs obtained from runtime DPTs of a first segment of a runtime test sequence already carried out on a runtime unit of the particular product, wherein the runtime unit is not part of the test plurality.

Then, block 1002 of example method 1000 may involve, based on the runtime input data, computing with the trained MLM predicted runtime probabilities of runtime test failures for all runtime DPTs of a second segment of the runtime test sequence including runtime DPTs not yet carried out on the runtime unit of the particular product, wherein the second segment follows the first segment in the runtime test sequence.

In accordance with example embodiments, a first runtime DPT of the second segment of the runtime test sequence may immediately follow a last runtime DPT of the first segment of the runtime test sequence. With this arrangement, the example method 1000 may further involve making a comparison of each of one or more of the predicted runtime probabilities against a respective failure threshold, and determining whether or not to carry out at least one runtime DPT of the second segment on the runtime unit of the particular product based on at least one of the comparisons.

In accordance with example embodiments, a first runtime DPT of the second segment of the runtime test sequence may immediately follow a last runtime DPT of the first segment of the runtime test sequence. With this arrangement, the example method 1000 may further involve carrying out the first runtime DPT of the second segment on the runtime unit of the particular product, based on a determination that the predicted runtime probability of failure of the first runtime DPT of the second segment is below a failure threshold. Then, the trained MLM may receive as input updated runtime input data comprising both the runtime TVMs obtained from runtime DPTs of the first segment, and a runtime TVM obtained from the first runtime DPT of the second segment. Based on the updated runtime input data, the trained MLM may compute updated predicted runtime probabilities of runtime test failures for all runtime DPTs of the second segment except for the first runtime DPT of the second segment.

IV. CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

With respect to any or all of the message flow diagrams, scenarios, and flow charts in the figures and as discussed herein, each step, block, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer readable medium such as a storage device including RAM, a disk drive, a solid state drive, or another storage medium.

The computer readable medium can also include non-transitory computer readable media such as computer readable media that store data for short periods of time like register memory and processor cache. The computer readable media can further include non-transitory computer readable media that store program code and/or data for longer periods of time. Thus, the computer readable media may include secondary or persistent long term storage, like ROM, optical or magnetic disks, solid state drives, compact-disc read only memory (CD-ROM), for example. The computer readable media can also be any other volatile or non-volatile storage systems. A computer readable medium can be considered a computer readable storage medium, for example, or a tangible storage device.

Moreover, a step or block that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

In addition to the illustrations presented in FIGS. 1-8, further illustrative examples and depictions are presented in figures shown in Appendix A and Appendix B that accompany this disclosure.

While various aspects and embodiments have been disclosed herein, other aspects and embodiments will be apparent to those skilled in the art. The various aspects and embodiments disclosed herein are for illustrative purposes and are not intended to be limiting, with the true scope being indicated by the following claims.

What is claimed is:

1. A method carried out by a computing system comprising a computational implementation of a machine-learning-based model (MLM) configured for predicting failure probabilities of product tests scheduled in a future segment of a testing sequence based on test outcomes of different product tests completed during a prior segment of the testing sequence, the method comprising:

receiving a set of computer-readable training test-result sequence records (TRSRs), each respective training TRSR comprising a sequence of test results corresponding to a sequence of associated designated product tests (DPTs) previously carried out on a respective unit of a test plurality of units of a particular product, wherein each test result of the associated DPT includes a test-value metric (TVM) characterizing a particular aspect of the respective unit tested, and a pass/fail indicator (PFI) indicating whether the respective unit tested passed or failed the associated DPT, and wherein the DPTs of the corresponding sequence of associated DPTs are a subset of a master set of DPTs for testing the particular product;

within each of one or more training epochs carried out over the set of training TRSRs, carrying out a respective training iteration over each respective training TRSR of the set, wherein each respective training iteration comprises a sequence of training sub-iterations carried out successively over each given test result of the respective training TRSR, from a first test result to a last test result, wherein each training sub-iteration comprises:

(i) inputting to the MLM input data comprising the TVM of the given test result and the TVMs of any test results earlier in the sequence than the given test result, (ii) based on the input data, computing with the MLM respective predicted probabilities of test failures for the DPTs associated with all test results later in the sequence than the given test result, and (iii) based on the PFIs of all the test results later in the sequence than the given test result being applied as ground-truths, training the MLM to increase a statistical confidence of the predicted probabilities; and upon achieving, from the respective training iterations of the one or more training epochs, one or more thresholds of the statistical confidence of the predicted probabilities, configuring the trained MLM for runtime implementation among one or more computing devices.

2. The method of claim 1, wherein the MLM is configured to receive as input TVMs corresponding to all the DPTs of the master set of DPTs, and wherein inputting to the MLM the input data comprising the TVM of the given test result and the TVMs of any test results earlier in the sequence than the given test result comprises:

masking, on input, the TVMs of all the test results later in the sequence than the given test result; and masking, on input, the TVMs corresponding to all the DPTs of the master set of DPTs that are not part of the sequence of DPTs.

3. The method of claim 1, wherein each PFI is a binary value, and wherein, based on the PFIs of all the test results later in the sequence than the given test result being applied as ground-truths, training the MLM to increase the statistical confidence of the predicted probabilities comprises:

applying binary cross-entropy/log loss to compute and minimize a loss function that models loss in terms of a probability distribution of the PFIs of all the test results later in the sequence than the given test result.

4. The method of claim 1, wherein the MLM comprises an artificial neural network.

5. The method of claim 1, wherein each of the one or more training epochs differ from one another by an order in which the training iterations are carried out over the set of training TRSRs.

6. The method of claim 1, wherein two or more training epochs are carried out, and wherein configuring the trained MLM for runtime implementation among one or more computing devices comprises determining which of two or more training epochs yields a trained MLM having a model-performance metric that most exceeds a model-evaluation threshold.

7. The method of claim 1, further comprising:

inputting to the trained MLM runtime input data comprising runtime TVMs obtained from runtime DPTs of a first segment of a runtime test sequence already carried out on a runtime unit of the particular product, wherein the runtime unit is not part of the test plurality; and based on the runtime input data, computing with the trained MLM predicted runtime probabilities of runtime test failures for all runtime DPTs of a second segment of the runtime test sequence comprising runtime DPTs not yet carried out on the runtime unit of the particular product, wherein the second segment follows the first segment in the runtime test sequence.

8. The method of claim 7, further comprising:

making a comparison of each of one or more of the predicted runtime probabilities against a respective failure threshold; and determining whether or not to carry out at least one runtime DPT of the second segment on the runtime unit of the particular product based on at least one of the comparisons.

9. The method of claim 7, wherein a first runtime DPT of the second segment of the runtime test sequence immediately follows a last runtime DPT of the first segment of the runtime test sequence, and wherein the method further comprises:

based on a determination that the predicted runtime probability of failure of the first runtime DPT of the second segment is below a failure threshold, carrying out the first runtime DPT of the second segment on the runtime unit of the particular product;

inputting to the trained MLM updated runtime input data comprising both the runtime TVMs obtained from runtime DPTs of the first segment, and a runtime TVM obtained from the first runtime DPT of the second segment; and based on the updated runtime input data, computing with the trained MLM updated predicted runtime probabilities of runtime test failures for all runtime DPTs of the second segment except for the first runtime DPT of the second segment.

10. A computing system comprising a computational implementation of a machine-learning-based model (MLM) configured for predicting failure probabilities of product tests scheduled in a future segment of a testing sequence based on test outcomes of different product tests completed during a prior segment of the testing sequence, wherein the computing system is configured for carrying out operations including:

receiving a set of computer-readable training test-result sequence records (TRSRs), each respective training TRSR comprising a sequence of test results corresponding to a sequence of associated designated product tests (DPTs) previously carried out on a respective unit of a test plurality of units of a particular product, wherein each test result of the associated DPT includes a test-value metric (TVM) characterizing a particular aspect of the respective unit tested, and a pass/fail indicator (PFI) indicating whether the respective unit tested passed or failed the associated DPT, and wherein the DPTs of the corresponding sequence of associated DPTs are subset of a master set of DPTs for testing the particular product;

within each of one or more training epochs carried out over the set of training TRSRs, carrying out a respective training iteration over each respective training TRSR of the set, wherein each respective training iteration comprises a sequence of training sub-iterations carried out successively over each given test result of the respective training TRSR, from a first test result to a last test result, wherein each training sub-iteration comprises:
  (i) inputting to the MLM input data comprising the TVM of the given test result and the TVMs of any test results earlier in the sequence than the given test result,
  (ii) based on the input data, computing with the MLM respective predicted probabilities of test failures for the DPTs associated with all test results later in the sequence than the given test result, and
  (iii) based on the PFIs of all the test results later in the sequence than the given test result being applied as ground-truths, training the MLM to increase a statistical confidence of the predicted probabilities; and upon achieving, from the respective training iterations of the one or more training epochs, one or more thresholds of the statistical confidence of the predicted probabilities, configuring the trained MLM for runtime implementation among one or more computing devices.

11. The computing system of claim 10, wherein the MLM is configured to receive as input TVMs corresponding to all the DPTs of the master set of DPTs, and wherein inputting to the MLM the input data comprising the TVM of the given test result and the TVMs of any test results earlier in the sequence than the given test result comprises:

masking, on input, the TVMs of all the test results later in the sequence than the given test result; and masking, on input, the TVMs corresponding to all the DPTs of the master set of DPTs that are not part of the sequence of DPTs.

12. The computing system of claim 10, wherein each PFI is a binary value, and wherein, based on the PFIs of all the test results later in the sequence than the given test result being applied as ground-truths, training the MLM to increase the statistical confidence of the predicted probabilities comprises:

applying binary cross-entropy/log loss to compute and minimize a loss function that models loss in terms of a probability distribution of the PFIs of all the test results later in the sequence than the given test result.

13. The computing system of claim 10, wherein the MLM comprises an artificial neural network.

14. The computing system of claim 10, wherein each of the one or more training epochs differ from one another by an order in which the training iterations are carried out over the set of training TRSRs.

15. The computing system of claim 10, wherein two or more training epochs are carried out, and wherein configuring the trained MLM for runtime implementation among one or more computing devices comprises determining which of two or more training epochs yields a trained MLM having a model-performance metric that most exceeds a model-evaluation threshold.

16. The computing system of claim 10, wherein the operations further include:

inputting to the trained MLM runtime input data comprising runtime TVMs obtained from runtime DPTs of a first segment of a runtime test sequence already carried out on a runtime unit of the particular product, wherein the runtime unit is not part of the test plurality; and based on the runtime input data, computing with the trained MLM predicted runtime probabilities of runtime test failures for all runtime DPTs of a second segment of the runtime test sequence comprising runtime DPTs not yet carried out on the runtime unit of the particular product, wherein the second segment follows the first segment in the runtime test sequence.

17. The computing system of claim 16, wherein the operations further include:

making a comparison of each of one or more of the predicted runtime probabilities against a respective failure threshold; and determining whether or not to carry out at least one runtime DPT of the second segment on the runtime unit of the particular product based on at least one of the comparisons.

18. A method carried out by a computing system comprising a computational implementation of a machine-learning-based model (MLM), wherein the MLM is configured for predicting failure probabilities of product tests scheduled in a future segment of a testing sequence based on test outcomes of different product tests completed during a prior segment of the testing sequence, wherein the MLM is trained with a set of computer-readable training test-result sequence records (TRSRs), each respective training TRSR comprising a sequence of test results corresponding to a sequence of associated designated product tests (DPTs) previously carried out on a respective unit of a test plurality of units of a particular product, wherein each test result of the associated DPT includes a test-value metric (TVM) characterizing a particular aspect of the respective unit tested, and a pass/fail indicator (PFI) indicating whether the respective unit tested passed or failed the associated DPT, and wherein the DPTs of the corresponding sequence of associated DPTs are a subset of a master set of DPTs for testing the particular product;

wherein training is arranged to train the MLM to predict, to one or more statistical confidence thresholds, probabilities of test failures for DPTs in a sub-sequence of any given testing sequence, based on input comprising TVMs in the any given testing sequence that precede the sub-sequence, and wherein the method comprises:

inputting to the trained MLM runtime input data comprising runtime TVMs obtained from runtime DPTs of a first segment of a runtime test sequence already carried out on a runtime unit of the particular product, wherein the runtime unit is not part of the test plurality; and based on the runtime input data, computing with the trained MLM predicted runtime probabilities of runtime test failures for all runtime DPTs of a second segment of the runtime test sequence comprising runtime DPTs not yet carried out on the runtime unit of the particular product, wherein the second segment follows the first segment in the runtime test sequence.

19. The method of claim 18, further comprising:

making a comparison of each of one or more of the predicted runtime probabilities against a respective failure threshold; and determining whether or not to carry out at least one runtime DPT of the second segment on the runtime unit of the particular product based on at least one of the comparisons.

20. The method of claim 18, wherein a first runtime DPT of the second segment of the runtime test sequence immediately follows a last runtime DPT of the first segment of the runtime test sequence, and wherein the method further comprises:

based on a determination that the predicted runtime probability of failure of the first runtime DPT of the second segment is below a failure threshold, carrying out the first runtime DPT of the second segment on the runtime unit of the particular product;

inputting to the trained MLM updated runtime input data comprising both the runtime TVMs obtained from runtime DPTs of the first segment, and a runtime TVM obtained from the first runtime DPT of the second segment; and based on the updated runtime input data, computing with the trained MLM updated predicted runtime probabilities of runtime test failures for all runtime DPTs of the second segment except for the first runtime DPT of the second segment.

* * * * *